United States Patent [19]
Seki

[11] Patent Number: 5,349,212
[45] Date of Patent: Sep. 20, 1994

[54] SEMICONDUCTOR DEVICE HAVING THYRISTOR STRUCTURE

[75] Inventor: Yasukazu Seki, Kawasaki, Japan

[73] Assignee: Fuji Electric Co., Ltd., Kanagawa, Japan

[21] Appl. No.: 69,003

[22] Filed: May 28, 1993

[30] Foreign Application Priority Data

Jun. 1, 1992 [JP] Japan .................................. 4-140359
Jun. 1, 1992 [JP] Japan .................................. 4-140360
Jun. 1, 1992 [JP] Japan .................................. 4-140361

[51] Int. Cl.⁵ ...................... H01L 29/74; H01L 27/02
[52] U.S. Cl. .................................... 257/133; 257/132; 257/146; 257/154; 257/162; 257/167; 257/169; 257/170; 257/378; 257/380
[58] Field of Search ................ 257/132, 133, 146, 154, 257/162, 167, 169, 170, 378, 380, 401

[56] References Cited

U.S. PATENT DOCUMENTS

| | | |
|---|---|---|
| 4,779,125 | 10/1988 | Remmerie et al. ................... 257/162 |
| 4,786,958 | 11/1988 | Bhagat . | |
| 4,914,496 | 4/1990 | Nakagawa et al. . | |
| 5,182,220 | 1/1993 | Ker et al. ............................ 257/133 |
| 5,245,202 | 9/1993 | Yasukazu ............................ 257/133 |

FOREIGN PATENT DOCUMENTS

0164867A2 12/1985 European Pat. Off. .
0424710A2 5/1991 European Pat. Off. .

*Primary Examiner*—Ngan Van Ngo
*Attorney, Agent, or Firm*—Finnegan, Henderson, Farabow, Garrett & Dunner

[57] ABSTRACT

A channel in which electron current is supplied from n+ type source layer to an n− type base layer is formed in a thyristor portion by using a first gate electrode to have an electrical connection in a thyristor state. Injection of hole current to a p type base layer, which is necessary to maintain the thyristor state is extracted to a source terminal by a control MOSFET portion including a second gate electrode a turn-off time and the state of this device is changed to the transistor state similar to that in the IGBT so that a short switching time turn-off is realized.

10 Claims, 12 Drawing Sheets

CURRENT DENSITY
110A/cm²

CURRENT DENSITY
110A/cm²

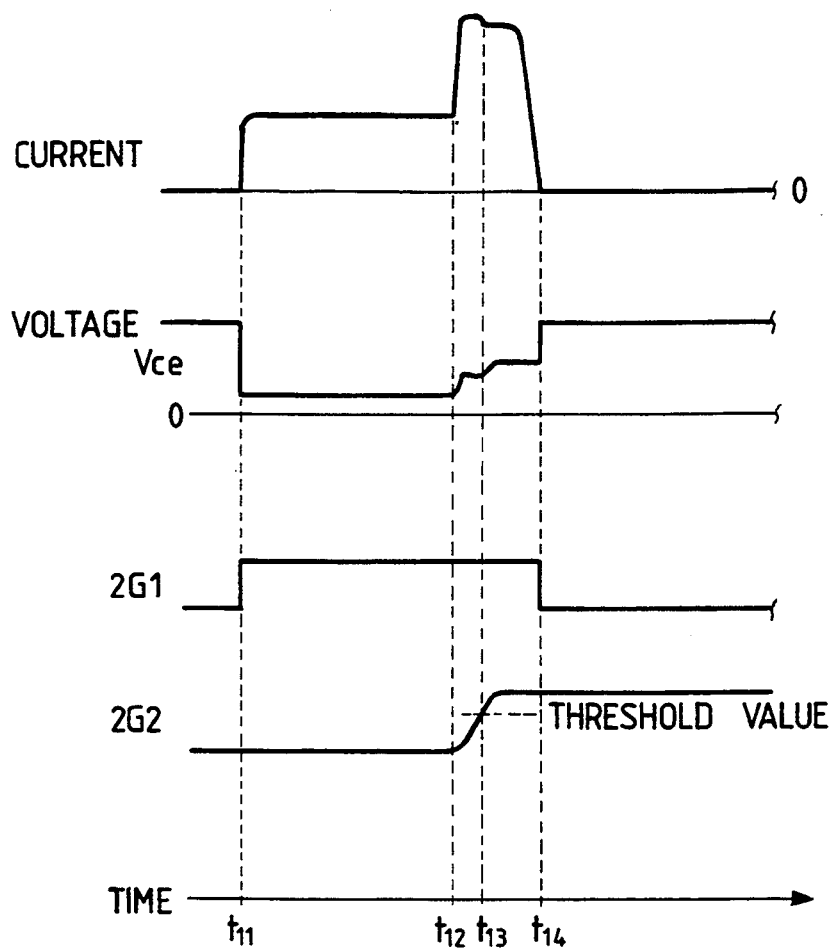
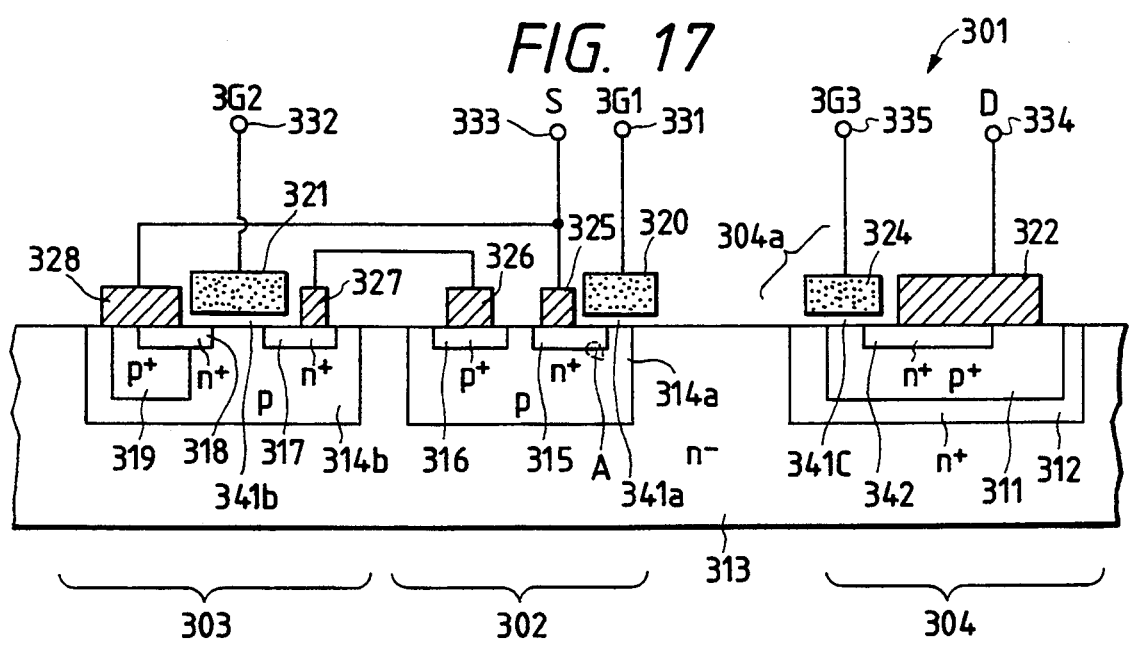

SEMICONDUCTOR DEVICE HAVING THYRISTOR STRUCTURE

BACKGROUND OF THE INVENTION

The present invention relates to a structure of an MOS semiconductor device which is used as a power device and so forth.

In the field of the semiconductor device, the high performance, high breakdown voltage and the large current operation have been intended. The performances are rapidly improved. Among power devices in which large current can be controlled at a high breakdown voltage, the IGBT (Insulating Gate type Bipolar Transistor) and the MCT (MOS gate Control Thyristor), etc., as well as the power MOSFET have been proposed as an MOS gate type transistor in which the device drive can be carried out by a voltage, which device have been main in the power device. Particularly, in the IGBT, a remarkable technical innovation such as a low generation loss, i.e., reduction of ON voltage in the supply of a large current at the conduction of the device and the shortening of the switching time (high speed response) at the on or off for current have been advanced so that it is put in practical use. FIG. 1 shows one example of the IGBT. Since the IGBT has a structure similar to that of a power MOSFET and it is a semiconductor device using the conductivity modulation, the IGBT has a feature such as a low state voltage. The operation of the device will be described below.

In FIG. 1, an IGBT 40a is a vertical IGBT in which an n+type buffer layer 43 and an n−type conductivity modulation layer 44 are stacked on a p+type semiconductor substrate 42 to which a drain electrode 51 is connected and which is used as a drain layer. On the surface of the n−type conductivity modulation layer 44, a p type base layer 47 is formed by diffusion using a polycrystalline silicon (gate electrode) 52 formed on a silicon oxide film (gate oxide film) 45 as a mask. In the p type base layer 47, an n+type source layer 48 and a p+type contact layer 49 are formed and a source electrode 50 is connected to these n+type source layer 48 and the p+type contact layer 49. A polycrystalline silicon gate electrode 52 is disposed across the edge of the source layer 48, the p type base layer 47 and the surface of the n−type conductivity modulation layer 44 through the silicon oxide film 45. A source terminal 60 is connected to the source electrode 50, a drain terminal 61 is connected to the drain electrode 51, and a gate terminal 62 is connected to the gate electrode 52.

In the IGBT having such structure, when a positive drain electric potential is applied to the drain electrode 51 with respect to the source electric potential which is applied to the source electrode 51 and a positive electric potential is applied to the gate electrode 52 with respect to the source electric potential, the polarity of a surface 53 of the p type base layer 47 positioned just under the gate electrode 52 through the silicon oxide film 45 is changed to an n type inversion layer to operate as a channel. Thus, the electrons which are majority carriers, are injected into the n−type conductivity modulation layer 44 through the source electrode 50, the n+type source layer 48 and further the n type inversion layer formed in the surface 53 of the p type base layer 47. In accordance with the flow of the electrons, holes which are minority carriers are injected from the p+type semiconductor substrate 42 which is a drain layer. As a result, the n−type conductivity modulation layer 44 becomes a so-called state of conductivity modulation state in which electrons and holes coexist. Consequently, the IGBT 40a can be operated under a low ON state voltage.

Thus, the IGBT is a semiconductor device in which the electrons and holes similarly coexist in the conductivity modulation layer as in the thyristor and a low ON state voltage can be realized. Further, the IGBT is differentiated from the thyristor in which the device drive can be carried out by current and namely, if passing electric current is set to about zero, OFF operation is not made. Since in the IGBT, the voltage control can be conducted by an insulating gate, it is noted as a switching device to which the high frequency can be applied with a low ON voltage. As the IGBT is a bipolar mode device in which carriers of both electrons and holes coexist, the switching time itself is slow in comparison to the switching time of a unipolar mode device which uses only carriers of merely electrons, such as MOSFET. However, the turn-off time has been shortened by introduction of the life time killer, etc. As described above, the IGBT is superior to the thyristor in that the generation loss can be controlled by an MOSFET and that it has a high switching speed. Thus, the IGBT is noted as a device in which a low ON as in the thyristor can be realized.

One of the most important key technology in solving the problems such as high efficiency, miniaturization, low cost, etc., in the power electronics, is to decrease a loss of the power device. Thus, the development of the power device in which the turn-off time is short and at the same time, the ON voltage is low, is required. Consequently, in the above-mentioned IGBT 40a, to more decrease the ON voltage is needed. However, the IGBT 40a is a semiconductor device in which the base current of the pnp transistor consisting of the built-in p+type semiconductor substrate 42 which is a drain layer, the n−type conductivity modulation layer 44 and the p type base layer 47, is supplied from a MOSFET which is controlled by the gate electrode 52. Thus, the ON voltage of the IGBT 40a cannot be lowered to a level below the ON voltage of the pnp transistor. Further, the increase of the ON voltage by the JFET effect in passing the MOSFET portion formed in the IGBT 40a cannot be ignored. Namely, in the IGBT 40a, electrons are supplied from the n+type source layer 48 to the n−base layer 44 through the n type inversion layer formed on the surface 53 of the p type base layer 47 and the n−type base layer 44 has a state of the conductivity modulation to decrease resistance. In the IGBT 40a, the pn junction between the n+type source layer 48 and the p type base layer 47 is maintained, which is differentiated from the thyristor (in the thyristor structure, the pn junction is broken). Consequently, the electron current flows in the n type inversion layer of the surface 53 and the hole current flows in one-sided way along the n type inversion layer by the JFET effect. Thus, the IGBT 40a has limits in reduction of the ON resistance due to the channel resistance and the increase of resistance by the JFET effect. As explained above, the IGBT is a semiconductor device having such a large merit that turn-off and the turn-on can be carried out by using the MOSFET. Nevertheless, the IGBT is a device having the above-mentioned basic problems and it has limits in the decrease of the ON voltage.

On the other hand, from the viewpoint of the decrease of the ON voltage, the ON voltage can be further decreased by adopting a semiconductor device having a thyristor structure. However, in the semiconductor device having a thyristor structure, the device drive is carried out by the current, so that the turn-off cannot be easily carried out and the shortening of the turn-off time is difficult. Thus, the realization of the power device having a required property is difficult. Although a MOS gate type thyristor device has been proposed, the turn-off proof is low and the realization of the low ON resistance in the MOSFET is needed. Solving the problem is also difficult as in the problem in the IGBT.

SUMMARY OF THE INVENTION

Therefore, in view of the above-described problems, an object of the present invention is to provide a semiconductor device in which the low ON voltage in the thyristor structure can be realized while the device can be controlled by using the MOSFET.

According to a first aspect of the present invention, to realize a semiconductor device which is operable in a thyristor state at the ON time and in a transistor state like the IGBT at the OFF time, the semiconductor device is provided with a first gate electrode which is turned on in the thyristor state and a second gate electrode which is changed from the thyristor state to the transistor state. Namely, in a semiconductor device having, in a surface of a second conductive type base region, a first conductive type drain region connected to a drain electrode, a first conductive type first base region formed at a position separated from this drain region, a first conductive type second base region formed at a position separated from this drain region and the first base region; a first MIS portion capable of connecting a second conductive type first source region formed in the first base region to the second conductive type base region is formed, and a second MIS portion including a second conductive type second source region formed in the second base region and a second conductive type drain region is formed, and further the first source region and the second source region are electrically connected, and the first base region and the second conductive type drain region are electrically connected.

The semiconductor device according to the first aspect of the present invention is effective in the structure in which the drain electrode is electrically connected to the side of the second conductive type base region as well as the first conductive type drain region. As a means for the electrical connection, it is preferable that the first conductive type drain region is formed in a second conducting type buffer region formed in the surface side of the second conductive type base region, and the drain electrode is electrically connected to the second conductive type base region through this buffer region.

A semiconductor device according to the second aspect of the present invention has, at a position facing to a first conductive type drain region to which drain electric potential is applied in a second conductive type base region, a thyristor portion including a first conductive type base region, a source region formed in the first conductive type base region, to which a source electric potential is applied, and a first gate electrode disposed across the source region, the first conductive type base region, and the second conductive type base region; and is characterized in that it has a controlling MISFET including a second gate electrode by which the connection of the first conductive type base region with the source region can be controlled.

As such controlling MISFET, a controlling MISFET portion including a controlling MISFET provided with a second gate electrode formed in a first conductive type MIS base region, which is formed on the second conductive type base region in the manner that the base region is separated from the first conductive type base region, is preferably used. It is preferable that the source electric potential is applied to the MIS source layer forming the MISFET as well as the MIS base region and the M I S drain layer is connected to the first conductive type base region.

Further, in the semiconductor device having these first and second electrodes, it is preferable that it has an electric current detecting portion including at least one set of a first conductive type detection base layer in the second conductive type base region, a second conductive type detection source layer formed in the detection base layer and a detection gate electrode disposed across the detection source layer and the second conductive type base region, the source electric potential is applied through a resistance means connected in series to the detection source layer, and the detection source layer is connected to the second gate electrode. To unify the resistance means with the semiconductor device, a polycrystalline silicon resistance formed on the second conductive type base region is preferably used as the resistance means.

According to a third aspect of the present invention, a semiconductor device includes a first gate electrode which is turned on in a thyristor state, a first control switching portion which causes to change a thyristor state to a transistor state, and a second control switching portion whose drain side is formed as a short drain structure at the turn-off time. Namely, the semiconductor device is provided with, at a surface side of a first conductive type base region, a thyristor portion including a second conductive type drain region to which a drain electric potential is applied through a drain electrode, a second conductive type base region formed at a position separated from the drain region, a source region formed in the second conductive type base region and to which a source electric potential is applied and a first gate electrode disposed across the source region, the second conductive type base region, and the first conductive type base region; a first control switching portion capable of controlling the connection between the source region side and the second conductive type base region; and a second control switching portion capable of controlling the connection between the first conductive type base region side and the drain electrode side.

The first control switching portion may be a first control MIS portion positioned on a second conductive type MIS base region formed in the first conductive type base region so as to be separated from the second conductive type base region, and in this case, this control MIS portion is provided with a first conductive type MIS source region to which the source electric potential is applied as well as to the second conductive type MIS base region, a first conductive type MIS drain region connected to said second conductive type base region, and a second gate electrode formed on those surface sides and to which a control signal is supplied.

The second control switching portion may be a second control MIS portion provided with a first conductive type drain region which forms a source at the first conductive type base side and which is formed in the second conductive type drain region and is electrically connected to the drain electrode; and a third electrode which is formed on those surface side and to which a control signal is supplied.

In the semiconductor device according to the first aspect of the present invention having the above-mentioned means, when the firs MIS portion is turned on while the drain potential is applied to the first conductive type drain region and the source potential is applied to the second conductive type first source region, majority carriers are injected from the second conductive type first source region to the second conductive type base region and in accordance with the injection, minority carriers are injected from the first conductive type drain region to the second conductive type base region. Thus, the transistor consisting of the first conductive type drain region, the second conductive type base region and the first conductive type first base region is turned on.

Consequently, majority of carriers are injected to the first conductive type first base region and at the same time, a transistor consisting of the second conductive type base region, the first conductive type first base region and the second conductive type first source region is turned on. Therefore, a thyristor consisting of the first conductive type drain region, the second conductive type base region, the first conductive type first base region and the second conductive type first source region is turned on. As a result, the electrical connection in the state of thyristor can be realized and the ON voltage can be reduced. When the second MIS portion is turned on from this state, the first conductive type first base region and the second conductive type first source region are shorted at the same potential through the second MIS portion, and the majority carriers flow out to the second conductive type first source region side through the second MIS portion. Consequently, the transistor consisting of the second conductive type base region, the first conductive type first base region and the second conductive type first source region is turned off. As a result, the state of the semiconductor device changes to the state of a transistor similar to the IGBT from the state of the thyristor and the carrier density in the device is decreased. Consequently, the turn-off time in a case where this semiconductor device is turned off by turning off the first MIS portions can be shortened.

Further, since, in the semiconductor device according to the first aspect of the present invention, all of the source region, drain region and the first and the second MIS gate portions are formed in the surface side of the device, the interconnection with other devices is easily made.

Further, in a case where the drain electrode is electrically connected to the second conductive type base region as well as the drain region, carriers remaining in the second conductive type base region can be directly extracted to the drain electrode side at the turn-off time so that the turn-off time can be more shortened.

In the semiconductor device according to the second aspect of the present invention, the majority carriers are injected from the source region to the second conductive type base region by applying the electric potential to electrically connect the source region to the second conductive type base region with respect to the source potential, to the first gate electrode. In accordance with the injection, the minority carriers are injected from the first conductive type drain region to the second conductive type base region, and a transistor consisting of the first conductive type drain region, the second conductive type base region and the first conductive type base region is turned on. Thus, the majority carriers are injected to the first conductive type base region and at the same time, a transistor consisting of the second conductive type base region, the first conductive type base region and the second conductive type source region is turned on. Consequently, a thyristor consisting of the first conductive type drain region, the second conductive type base region, the first conductive type base region and the second conductive type source region is turned on. As a result, the electrical connection in the state of thyristor can be realized so that the ON voltage can be decreased.

When the control MISFET having the second gate is turned on and the first conductive type base region and the source region are shorted, the majority carriers flow out to the source region side through the control MISFET. Consequently, the transistor consisting of the second conductive type base region, the first conductive type base region and the second conductive type source region is turned off. As a result, the state of the semiconductor device changes to the state of the transistor similar to the IGBT from the state of the thyristor and the carrier density in the device is decreased. Therefore, when the potential to shut the electrical connection of the source region and the second conductive type base region with respect to the source potential is applied to the first gate, the injection of electrons from the source region to the second conductive type base region can be stopped so that the semiconductor device can be turned off. That is, since the semiconductor device is turned on in a state of the thyristor at the ON time, the ON resistance can be reduced. Further, since the semiconductor device can be turned off in a state of the transistor similar to the IGBT at the OFF time, the turn-off time can be shortened.

By forming the first conductive type MIS base region on the second conductive type base region of such semiconductor device with an isolation from the first conductive type base region and applying the source potential to the MIS base region, the MIS base region can be isolated with a pn junction. Thus, a control MISFET consisting of the second gate, MIS source layer and the MIS drain layer can be formed on the MIS base region and a semiconductor device capable of changing from the state of thyristor to the state of transistor or from the state of transistor to the state of thyristor can be realized on a single substrate.

Further, by forming a current detecting portion on the second conductive type base region, current proportional to the current which flows in the thyristor portion can be caused to flow into the current detecting portion. Therefore, when the overcurrent flows into the thyristor portion by some reason, current proportional thereto is caused to flow into the current detecting portion and the voltage drop of the resistance means connected to the current detecting portion in series is increased. Therefore, since the control voltage which is applied to the second gate is increased, the control MISFET can be turned off and the semiconductor device is changed to a state of transistor which can be stopped so that it can immediately be turned off by the potential which is applied to the first gate electrode.

In the semiconductor device provided with an MIS gate type thyristor according to the third aspect of the present invention, majority carriers are injected from the source region to the first conductive type base region by applying the electric potential to electrically connect the source region to the first conductive type base region with respect to the source potential, to the first gate electrode. In accordance with the injection, minority carriers are injected from the second conductive type drain region to the first conductive type base region, and a transistor consisting of the second conductive type drain region, the first conductive type base region and the second conductive type base region is turned on. Thus, the majority carriers are injected to the second conductive type base region and at the same time, a transistor consisting of the first conductive type base region, the second conductive type base region and the first conductive type source region is turned on. Consequently, a thyristor consisting of the second conductive type drain region, the first conductive type base region, the second conductive type base region and the first conductive type source region is turned on. As a result, the electrical connection in the state of thyristor can be realized and the ON voltage can be decreased.

When the first control switching portion, for example, the first control MIS portion having the second gate is turned on and the second conductive type base region and the source region are shorted, the majority carriers flow out to the source region side through the first control MIS portion. Consequently, the transistor consisting of the first conductive type base region, the second conductive type base region and the first conductive type source region is turned off. As a result, the state of the semiconductor device changes to the state of a transistor similar to the IGBT from the state of the thyristor. When the potential to shut the electrical connection of the source region and the first conductive type base region with respect to the source potential is applied to the first gate, the injection of electrons from the source region to the first conductive type base region can be stopped so that the semiconductor device can be turned off.

A second control MIS portion including a second control switch portion capable of controlling the connection between the first conductive type base region side and the drain electrode side, for example, the third gate electrode, is provided at the drain region side. When the second control MIS portion is turned off before turning-off the semiconductor device, the drain region side forms a short drain structure, the injection of carriers from the second conductive type drain region to the first conductive type base region side is prevented. Further, at the turn-off time, the carriers of the first conductive type base region is directly extracted to a drain electrode and the reinjection of the carriers to the first conductive type base region does not occur. Therefore, since the semiconductor device according to the third aspect of the present invention is turned on in the thyristor state at the on time, the ON resistance can be reduced, and since the device can be turned off in the same state as in the IGBT having a short drain structure at the off time, the turn-off time can be shortened.

BRIEF EXPLANATION OF THE DRAWINGS

FIG. 16 is a timing chart showing the operation of the semiconductor device shown in FIG. 14;

FIG. 17 is a cross-sectional view showing a structure of the semiconductor device according to embodiment 5 of the present invention;

DETAILED DESCRIPTION OF THE INVENTION

Preferred embodiments of the present invention will now be described in detail with reference to the accompanying drawings.

EMBODIMENT 1

Figure 1:
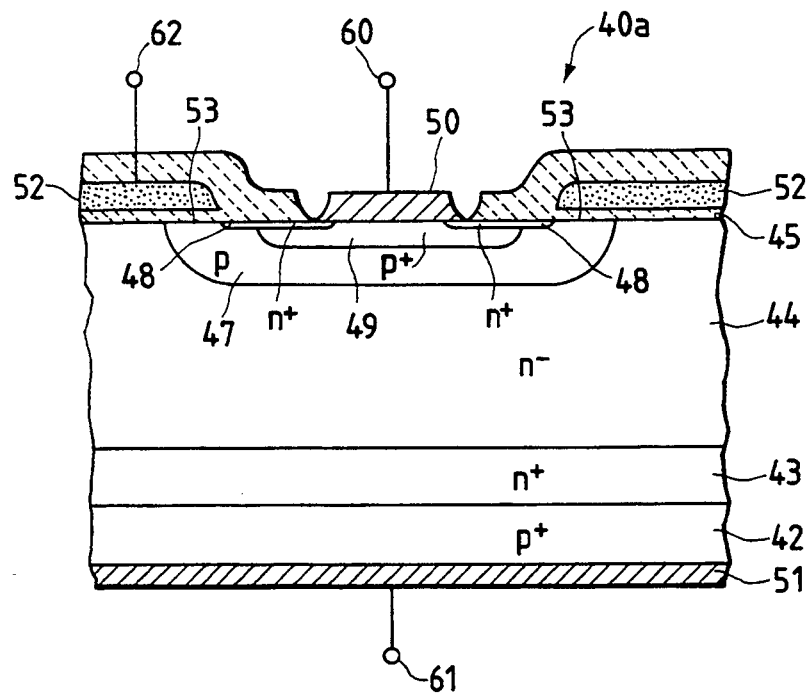
FIG. 1 is a cross-sectional view showing one example of a structure of a conventional IGBT.
Figure 2:
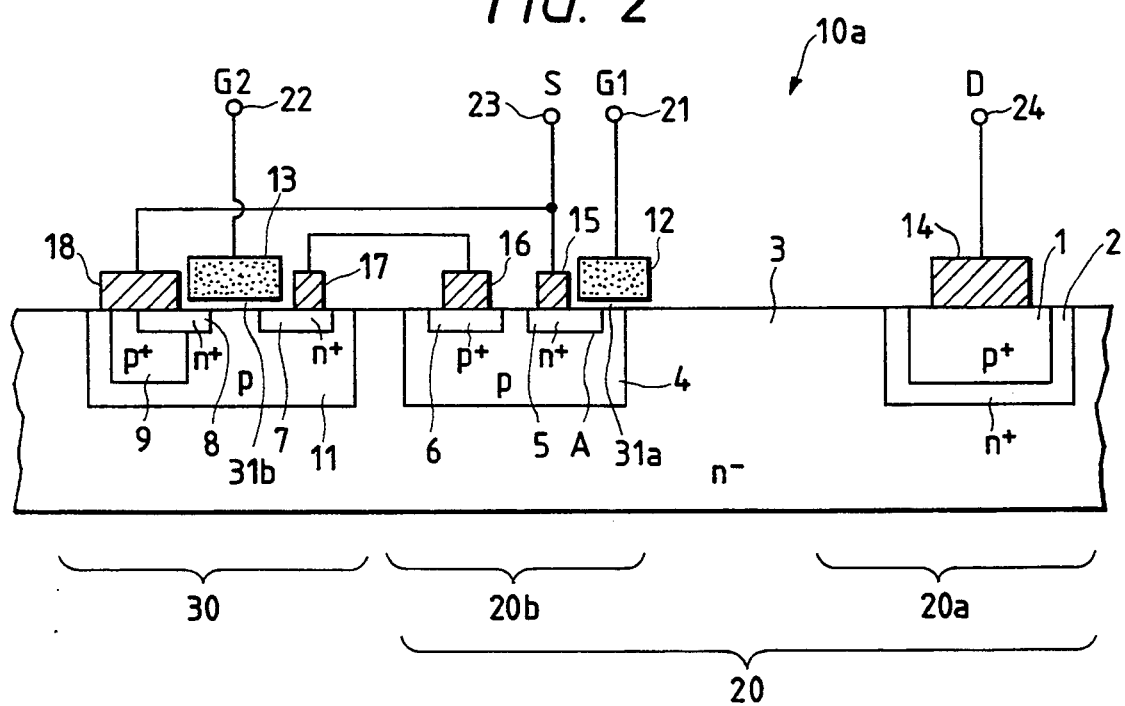
FIG. 2 is a cross-sectional view showing a structure of a semiconductor device according to embodiment 1 of the present invention.

FIG. 2 shows a structure of a semiconductor device provided with a first gate and a second gate according to embodiment 1 of the present invention. The semiconductor device of this embodiment is called as a dual gate MOS thyristor (DUGMOT) as it has two gates.

The semiconductor device 10a of this embodiment is a horizontal device and composed of a thyristor portion 20 having a drain portion 20a including, on a surface of an n⁻type (a second conductive type) base layer 3 formed by an epitaxial growth, etc., a drain layer 1 in which a drain electrode 14 connecting a drain terminal 24 is disposed, and a first MOSFET portion (a first MIS portion) 20b formed at a position facing to the drain portion 20a, the thyristor portion having a function as a switching device; and a control MOSFET portion (a second MIS portion) 30 which controls the thyristor portion 20.

The thyristor portion 20 includes the drain portion 20a and the first MOSFET portion 20b as described above. The drain portion 20a is composed of a well-shaped n⁺type buffer layer 2 formed on the surface of the n⁻type base layer 3 by a diffusion process and a p type (a first conductive type) drain layer 1 formed in a surface region inside the n⁺type buffer layer 2. Further, the first MOSFET portion 20b includes a p type base layer (a first base region) 4 which is a well-shaped p type diffusion layer formed on the surface of the n⁻type base layer 3, an n⁺type source layer (a first source region) 5 formed in a surface region inside the p type base layer 4 and a p⁺type contact layer 6. A polycrystalline silicon first gate electrode 12 is disposed across the n⁺type source layer 5, the p type base layer 4 and the n⁻type base layer 3 through a gate oxide film 31a.

The control MOSFET portion 30 includes a p type MOS base layer (a second base region) 11 which is a well-shaped p type diffusion layer formed on the surface of the n⁻type base layer 3, an n⁺type MOS drain layer 7 formed in the surface inside the p type MOS base layer 11, and MOS source layer (a second source region) 8, and further a p⁺type MOS contact layer 9 formed adjacent to the MOS source layer 8 as in the first MOSFET portion 20b. A polycrystalline silicon second gate electrode 13 is disposed across the n⁺type MOS source layer 8 and the n⁺type MOS drain layer 7 through the gate oxide film 31b.

A source electrode (a first source electrode) 15 connected to a source terminal 23 is disposed on the n⁺type source layer 5 of the first MOSFET portion 20b, and a connecting electrode 16 is disposed on the p⁺type contact layer 6. Further, a MOS source electrode (a second source electrode) 18 connected to the source terminal 23 is disposed on the n⁺type source layer 8 and the p⁺type MOS contact layer 9, and a connecting electrode 17 connected to the connecting electrode 16 is disposed on the n⁺type MOS drain layer 7. Moreover, the first gate electrode 12 is connected to the first gate terminal 21 and the second gate electrode 13 is connected to the second gate terminal 22. The respective channels are formed by the control signals from the outer portion.

Figure 3:
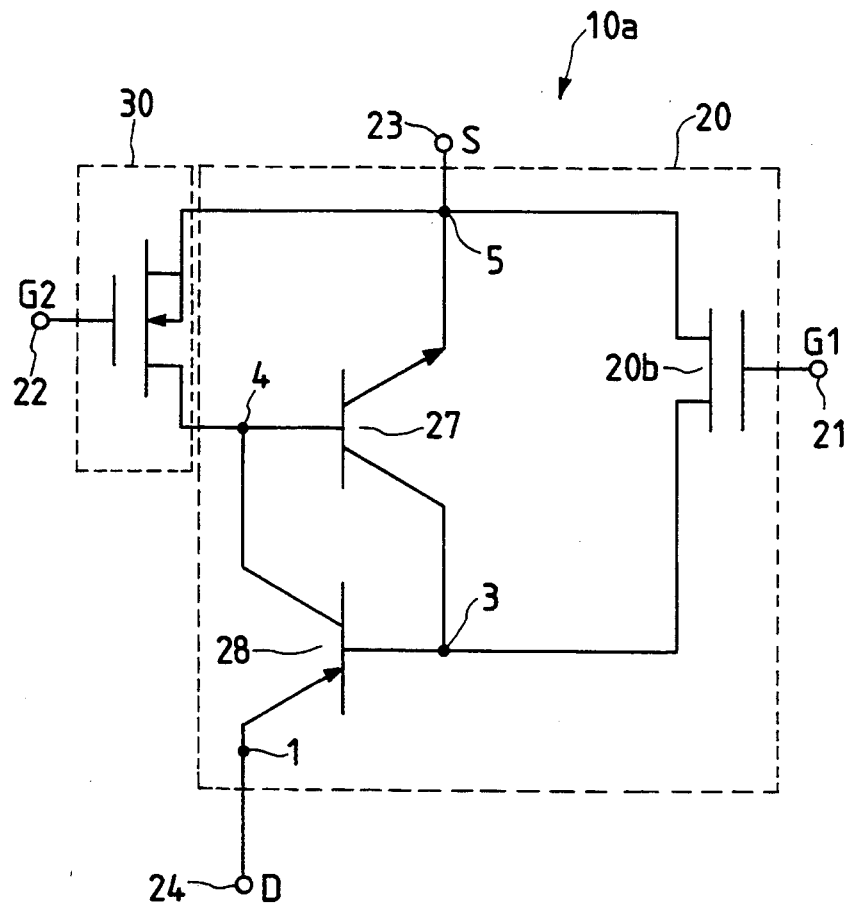
FIG. 3 is a circuit diagram showing an equivalent circuit of the semiconductor device according to embodiment 1.

FIG. 3 shows an equivalent circuit of the semiconductor device shown in FIG. 2. The device 10a is composed of the thyristor portion 20 which is controlled by the first gate terminal 21 and the control MOSFET portion 30 which is controlled by the second gate terminal 22. In the thyristor portion 20, an npn type transistor 27 is composed of the n⁺type source layer 5, the p type base layer 4 and the n⁻base layer 3. Further, a pnp type transistor 28 is composed of the p type base layer 4, the n⁻type base layer 3, the n⁺buffer layer 2 and the p⁺type drain layer 1. Therefore, a thyristor is composed of these npn type transistor 27 and pnp type transistor 28. The first MOSFET portion 20b is formed with respect to these npn type transistor 27 and pnp type transistor 28 in the manner that the base of the pnp type transistor 28 is connected to the source terminal 23 (source electrode 15). The control MOSFET portion 30 is constructed in such a manner that the base of the npn type transistor 27 is connected to the source terminal 23 (source electrode 15).

Figure 4:
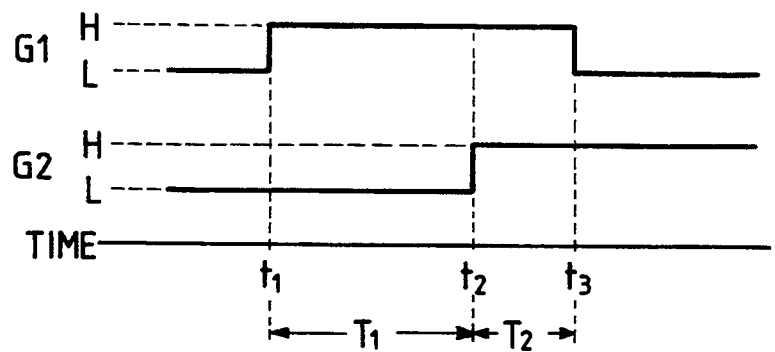
FIG. 4 is a timing chart showing signals supplied to two gate terminals of the semiconductor device according to embodiment 1 and the operating state of the semiconductor device.

The operation of the device 10a having such structure will be explained with reference to the timing chart shown in FIG. 4. FIG. 4 shows signals supplied to the first gate terminal 21 and the second gate terminal 22 to control the device 10a. In FIG. 4, H denotes high level signals and L denotes low level signals.

In the device 10a, the first MOSFET portion 20b with the first gate electrode 12 which is controlled by the first gate terminal 21 and the control MOSFET portion 30 with the second gate electrode 13 which is controlled by the second gate terminal 22, have equally the n channel type structure. High level signals are supplied to the first and the second gate terminals 21 and 22 so that the first MOSFET portion 20b and the control MOSFET portion 30 can be turned on. First, when a high level signal is supplied to the first gate terminal 21 at a time t1 to hold the first gate electrode 12 at a high potential, the surface of the p type base layer 4 is changed to an n type inversion layer (channel) so that the source electrode 15, the n type source layer 5, the n type inversion layer in the surface of the p type base layer 4 and the n⁻type base layer 3 are connected. Thus, electrons are injected from the source electrode 15 to the n⁻type base layer 3. In accordance with the injection, holes are injected from the p⁺type drain layer 1 to the n⁻type base layer 3 so that the n⁻type base layer 3 has a conductivity modulation state, which means that the pnp type transistor 28 have been turned on. Additionally, since the hole current of this pnp type transistor 28 becomes the base current of the npn type transistor 27, the npn transistor 27 is turned on. Namely, the thyristor composed of the p⁺type drain layer 1, the n⁻type base layer 3, the p type base layer 4 and the n⁺type source layer 5 is turned on. Consequently, the pn junction at the connecting portion A between the n⁺type source layer 5 and the p type base layer 4 is broken and a large number of electrons are injected from the entire connecting portion A between the n⁺type source layer 5 and the p type base layer 4 to the p⁺type drain layer 1 side through the p type base layer 4 so that highly concentrated carriers exist in the device and the ON resistance is decreased. Thus, the semiconductor device 10a is changed to a thyristor state during the operation by holding the first gate electrode 12 at a high potential and it becomes a power device having a low ON voltage.

Since the semiconductor device 10a is operated in a thyristor state as described above, the electron current is not supplied through the n type inversion layer which is formed by the first gate electrode 12. Consequently, even if the n type inversion layer is removed by keeping the first gate electrode 12 at a low electric potential, the device 10a cannot be turned off. Then, when, in the present device 10a, a high level signal is supplied to the second gate terminal 22 at a time t2 before the turn-off time and the MOSFET is electrically connected, the hole-current supplied to the base of the npn transistor 27 flows into the source terminal 23. Then, as the base of the npn transistor 27 is shorted to the emitter, the npn transistor 27 is turned off. Consequently, the pn junction at the connecting portion A between the n+type source layer 5 and the p type base layer 4 is reformed and the thyristor operation is not made with the result that a state of the device 10a is changed to a transistor state where only the pnp type transistor 28 is operated.

This state is the same operating state as in the IGBT in which the electron current, etc. can be controlled by the n type inversion layer formed by the first gate electrode 12.

Then, when a low level signal is supplied to the first gate terminal 21 to keep the first gate electrode 12 at a low potential, the n type inversion layer which has been formed in the surface of the p type base layer 4 disappears so that the pnp type transistor 28 can be turned off and the device 10a is not operated. In the present device 10a, the operation thereof during the turn-off time is in a transistor state similar to that in the IGBT. Thus, the turn-off waveform of the device completely the same as in the IGBT, and the turn-off time is short like the IGBT.

As described above, the device 10a is a completely new device in which a low ON voltage thyristor state (period T1 between time t1 and t2) and a short turn-off time transistor state (period T2 between time t2 and t3) as in the IGBT was realized by use of two gate electrodes. Also, in the device 10a, the trade-off between the reduction of the ON voltage and the switching time is remarkably improved. Namely, since the device 10a is operated in a thyristor state during the supply for current while having a short switching time as in the IGBT, the ON voltage can be more decreased to a large extent than in a conventional IGBT so that the low loss power device can be realized. Additionally, the device 10a has a feature that a thyristor can be controlled by the voltage drive.

Further, the device 10a is a horizontal device having all the electrodes in the surface side of the device. Therefore, the interconnection with other devices is easily made and the device 10a can be assembled in devices and circuits in the middle and large current and the middle and high breakdown voltage so that the performances can be improved.

EMBODIMENT 2

Figure 5:
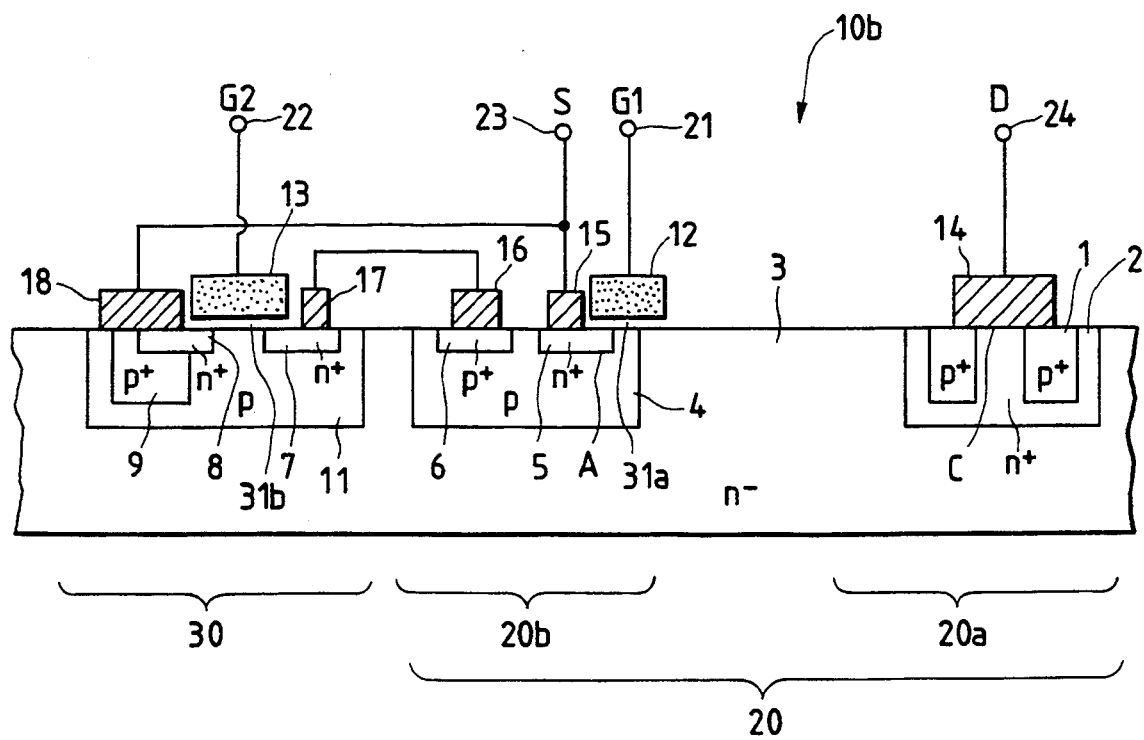
FIG. 5 is a cross-sectional view showing a structure of a semiconductor device according to embodiment 2 of the present invention.

FIG. 5 shows a structure of a semiconductor device including double gates of a first gate and a second gate according to embodiment 2 of the present invention. The structure and the operation of the semiconductor device of this embodiment are substantially the same as the semiconductor device 10a of embodiment 1. Thus, the common portions are denoted by the same reference numerals and the explanation thereof is omitted.

The characteristic point of the semiconductor device 10b of this embodiment resides in that the drain portion 20a is formed in the manner that it has an anode short structure. Namely, the p+type drain layers 1 are separately formed in the surface of the n+type buffer layer 2 in the device 10b, and a drain electrode 14 is electrically connected to both the n+type buffer layer 2 and the p+type drain layer 1. Namely, the drain electrode 14 is also electrically connected to a side of an n−type base layer 3 as well as the p+type drain layer 1.

The device 10b having such structure can be operated in the low ON voltage as in the semiconductor device 10a of embodiment 1. On the other hand, since, in the switching performance of the device 10b, the drain electrode 14 is electrically connected to the n+type buffer layer 2, excess carriers stored in the n−type base layer 3 can be directly extracted to the drain electrode 14 as the electron current through the connecting portion C between the n+type buffer layer 2 and the drain electrode 14 at the turn-off time. Therefore, since the removal of the excess carriers is more rapidly made, the turn-off time can be more shortened without reinjection of the holes.

In the embodiments 1 and 2, the conductive type of each element portion may be changed to the opposite type. Further, various structures of each base layer, source layer and the first and second MOSFET portion, etc., can be adopted without limiting them to the present embodiments.

As described above, in the semiconductor device according to embodiments 1 and 2 of the present invention, the low ON state voltage as in the thyristor can be realized at on time by using the first gate electrode and the second gate electrode and the short switching time as in the IGBT can be also realized. Thus, the trade-off of the switching time and the ON voltage, which could not be realized in the conventional power semiconductor device such as MCT, IGBT, etc., can be remarkably improved. Therefore, the power device which is used in the devices and circuits for middle and large current, and for middle and high breakdown voltage can be obtained with high performances. Further, since the ON voltage is low and the switching speed is great, the switching loss can be reduced to a large extent in applying the high frequency. Thus, by using the semiconductor device according to the present invention, the low switching loss and miniaturization of various devices, which are required in saving of electric power, can be realized. Further, since all of the source region, drain region, first and second MIS gate portions are formed in the surface side of the devices, the interconnection with other devices is easily made.

Further, in a case where the drain electrode is electrically connected to the second conductive type base region side, carriers remaining in the second conductive type base region can be directly extracted in the drain electrode side so that the turn-off time is more shortened.

EMBODIMENT 3

Figure 6:
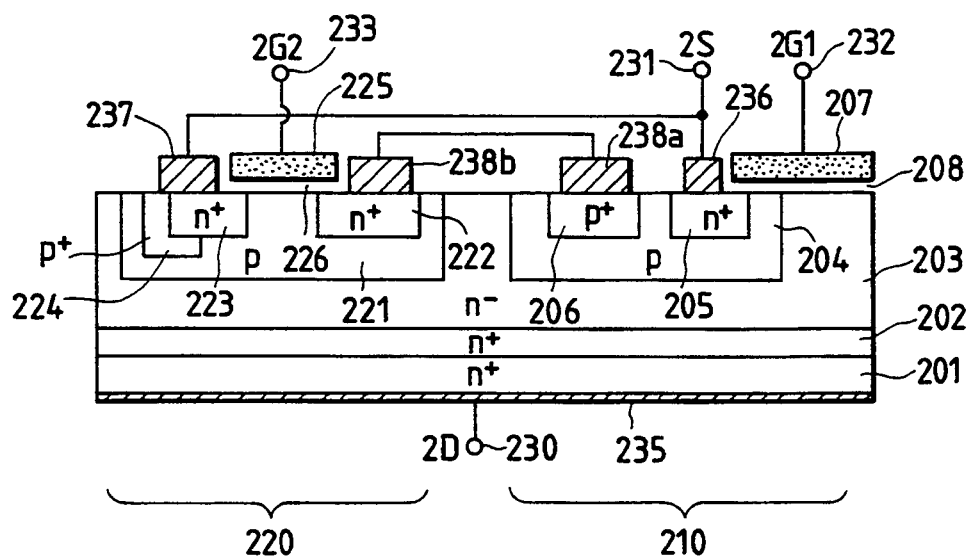
FIG. 6 is a cross-sectional view showing a structure of a semiconductor device of embodiment 3 of the present invention.

FIG. 6 shows a structure of a semiconductor device including a first gate and a second gate according to the third embodiment. The semiconductor device of this embodiment is called as a dual gate MOS thyristor (DUGMOT) as it has two gates. The semiconductor device of this embodiment is a vertical semiconductor device having a drain layer 201 of a p+type semiconductor substrate on the back of which a drain electrode 235 is arranged. On the drain layer 201, an n+type buffer layer 202 and an n−type base layer 203 are formed by the epitaxial growth, etc. On the surface of the n−type base layer 203, a thyristor portion 210 having a function as a switching device and a MOSFET portion 220 which controls the thyristor portion 10 are formed.

The thyristor portion 10 includes a well-shaped p type diffusion layer, i.e., p type base region 204 formed on a surface of an n−type base region 203, an n+type source layer 205 formed on the inner side surface of the p type base region 204 and a p+type contact layer 206. A first gate electrode 207 is disposed across the source layer 205, the p type base region 204 and the n−type base layer 203 through a gate oxide film 208.

The MOSFET portion 220 includes a well-shaped p type diffusion layer, i.e., p type MOS base region 221 formed on a surface of an n−type base region 203, an n+type MOS drain layer 222 and an MOS source layer 223 formed on the inner side surface of the p type MOS base region 221 and a p+type MOS contact layer 224 formed adjacent to the MOS source layer 223 as in the thyristor portion 210. A second gate electrode 225 is disposed across the MOS source layer 223 and the MOS drain layer 222 through a gate oxide film 226.

A source electrode 236 connected to a source terminal 231 is disposed on the source layer 205, and a drain electrode 235 connected to a drain terminal 230 is disposed on the drain layer 201. Further, on the MOS source layer 223 and the MOS contact layer 224 of the MOSFET portion 220, a MOS source electrode 237 connected to the source terminal 231, is disposed. On the MOS drain layer 222 and the contact layer 206 of the thyristor portion 210, lead electrodes 238a and 238b connected to each other are disposed. Further, the first gate electrode 207 is connected to a first gate terminal 2G1 and the second gate electrode 225 is connected to a second gate terminal 2G2. The respective channels are formed by control signals from the outer portions.

Figure 7:
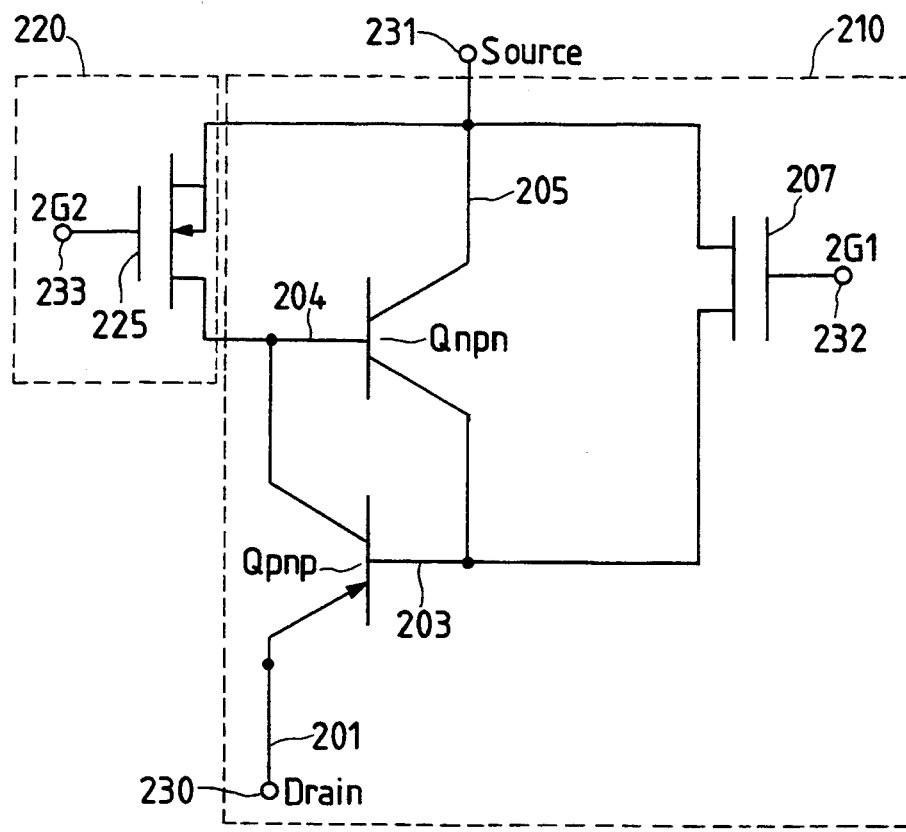
FIG. 7 is a circuit diagram showing an equivalent circuit of the semiconductor device shown in FIG. 6.

FIG. 7 shows an equivalent circuit of the semiconductor device of this embodiment. The semiconductor device is composed of the thyristor portion 210 which is controlled by the first gate terminal 2G1 and the MOSFET portion 220 which is controlled by the second gate terminal 2G2. The thyristor portion 210 includes an npn type transistor Qnpn composed of the n+type source layer 5, the p type base layer 4 and the n−type base layer 3 and a pnp type transistor Qpnp composed of the p type base layer 4, the n−type base layer 3, the n+type buffer layer 2 and the p+type drain layer 1. Therefore, the thyristor is composed of the transistors Qnpn and Qpnp. When a channel is formed just under the first gate electrode 207 by the signal from the first gate terminal 2G1, the transistor Qpnp is turned on and the hole current is supplied to the p type base layer 204 which is a base of the transistor Qnpn through the transistor Qpnp. Consequently, the thyristor is turned on.

The semiconductor device of this embodiment includes provides the MOSFET portion 220 which is capable of connecting the p type base layer 204 which is a base of the transistor Qnpn to the source terminal 231 in addition to the thyristor portion 210. Thus, when the MOSFET portion is electrically connected by the signal supplied to the second gate terminal G2, the hole current supplied to the base of the transistor Qnpn is caused to flow to the source terminal 31 side and the transistor Qnpn is turned off. Consequently, the semiconductor device of the present example is changed from the thyristor state to the transistor state in which the transistor Qpnp is on.

Figure 8:
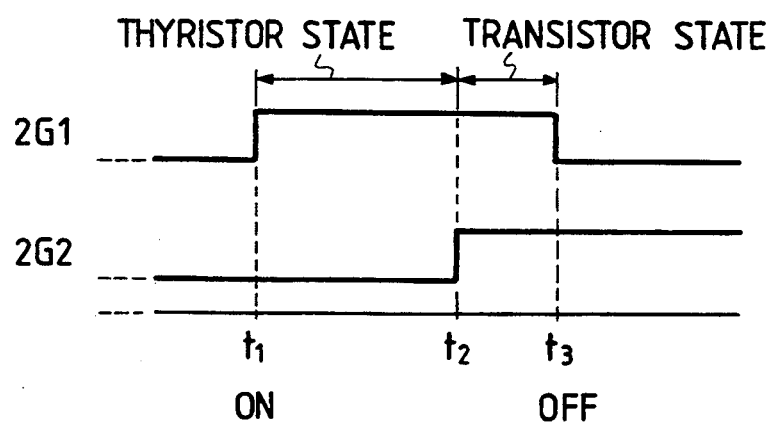
FIG. 8 is an explanatory view showing signal supplied to two gate terminals of the semiconductor device shown in FIG. 6 and the operating state of the semiconductor device.

FIG. 8 shows signals which is supplied to the gate terminals 2G1 and 2G2, for controlling the semiconductor device of this embodiment. In the semiconductor device, the MOSFET composed of the first gate electrode 207 which is controlled by the first gate terminal 2G1 and the MOSFET composed of the second gate electrode 225 which is controlled by the second gate terminal 2G2 are both n channel types. By supplying high level signals to the gate terminals G1 and G2, these MOSFET can be turned on. First, when a high level signal is supplied to the first gate terminal G1 at time t1, the transistor Qnpn and the transistor Qpnp are turned on and operated in a thyristor state. Next, when a high level signal is supplied to the second gate terminals 2G2 at time t2, the transistor Qnpn is turned off and the semiconductor device of this embodiment is changed to the transistor state. Thus, when a low level signal is supplied to the first gate terminal 2G1 at a time t3, the transistor Qnpn can be turned off and the semiconductor device is not operated. Consequently, the semiconductor device of the present example can be turned on in the thyristor state having a low ON voltage at a starting time and can be turned off in the transistor state as in an IGBT capable of voltage-controlling while having a short turn-off time at a stopping time.

Figure 9A:
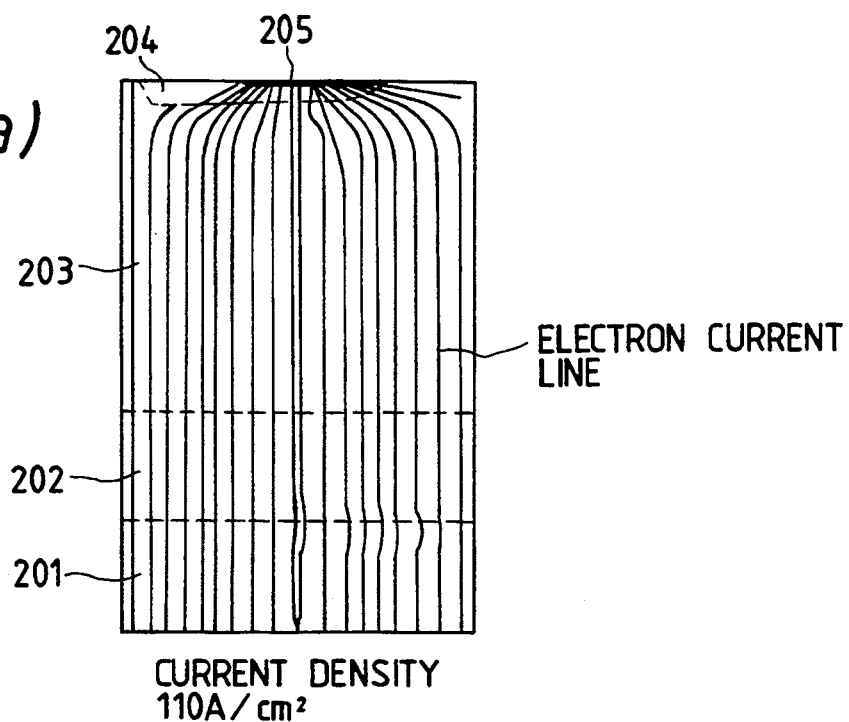
FIGS. 9(a) and 9(b) are explanatory views showing the flow of current in the semiconductor device shown in FIG. 6 while using electron current line and all current lines, respectively.
Figure 9B:
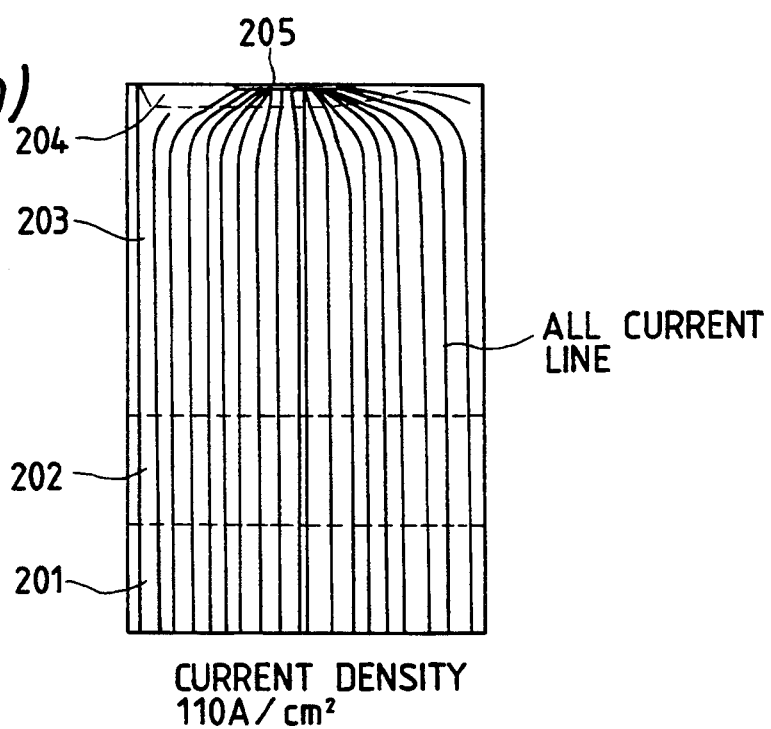

The semiconductor device of this embodiment will be described in more detail below while comparing a property of a semiconductor device of this embodiment to a property of the IGBT, confirmed by a simulation, etc. FIGS. 9 and 10 show the electron current line and all the current line in both the semiconductor device of this embodiment and the IGBT with reference to results obtained by the simulation. When in the semiconductor device of this embodiment, a high level voltage is applied to the first gate electrode 207 as explained above, the electron current is caused to flow from the source layer 205 to the n−type base layer 203 through the channel just under the first gate electrode 207 formed on the surface of the p type base layer 204. Consequently, since the hole current flows from the p+type drain layer 201 to the n−type base layer 203, the n−base layer 203 has a state of the conductivity modulation. This state is a state where the transistors Qpnp and Qnpn contained in the semiconductor device of this embodiment are turned on and corresponds to the state of the thyristor. As the result, the pn junction between the source layer 205 and the p type base layer 204 is broken and the electron current is caused to flow from the entire source layer 205 to the drain layer 201. The electron current (FIG. 9(a)) and all the current line (FIG. 9(b)) of the semiconductor device of this embodiment show the state well. Namely, the electron current flows from the source layer 205 to the p type base layer 204 and reaches the drain layer 201 through the n−type base layer 203 and the n+type buffer layer 202. Thus, it can be found that the semiconductor device of this embodiment is operated in a state of very low ON resistance.

Figure 10A:
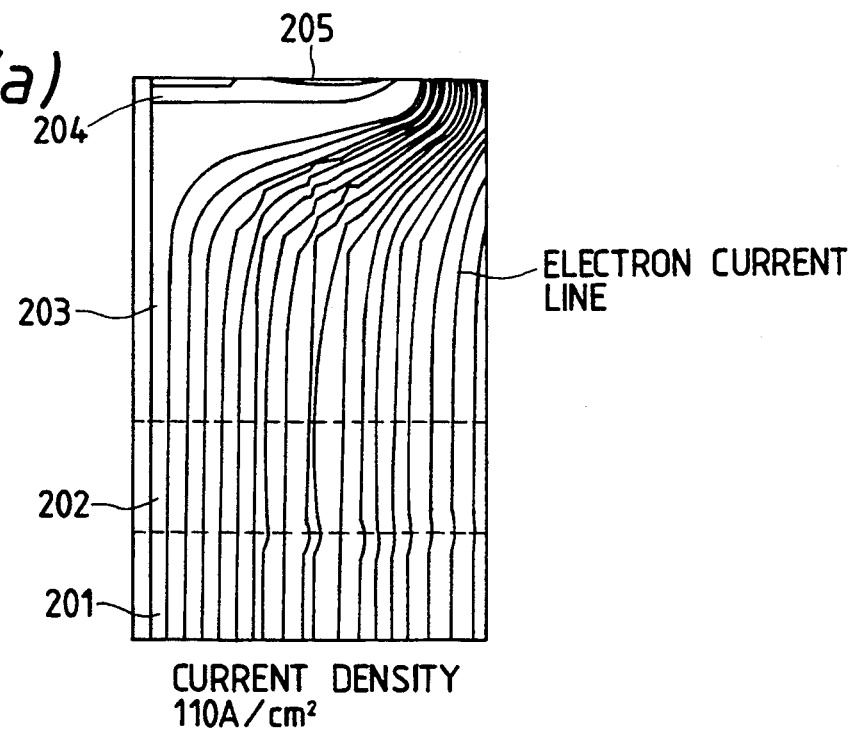
FIGS. 10(a) and 10(b) are explanatory views showing the flow of current in the IGBT while using electron current line and all current lines, respectively.
Figure 10B:
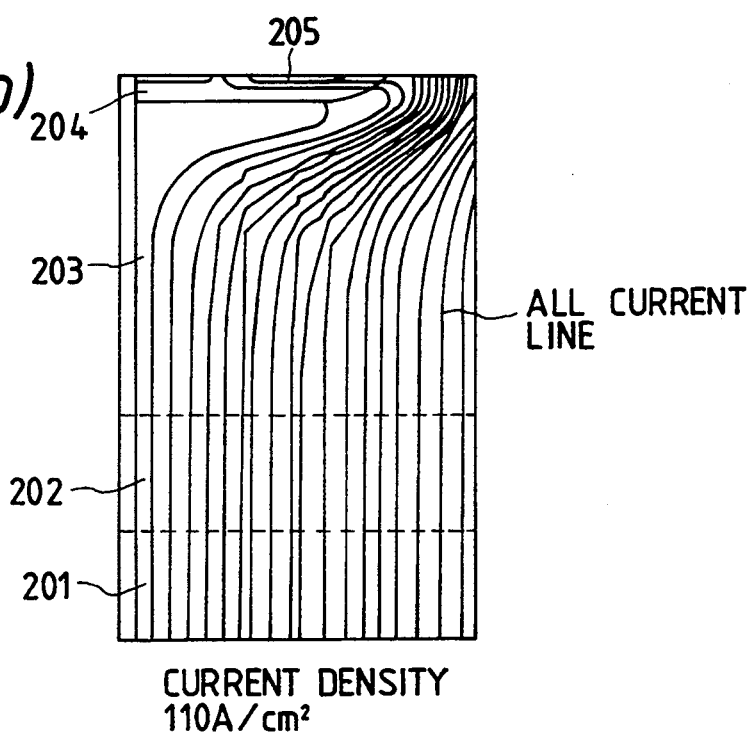

On the other hand, in the IGBT shown in FIG. 10, the operation in the state of thyristor is not carried out to prevent the latch up and the electron current is supplied from the source layer 205 to the n−type base layer through the channel formed in the p type base layer. Therefore, in the n−type base layer, the conductivity modulation occurs to reduce the resistance. However, the pn junction between the source layer 205 and the p type base layer 204 can be maintained, with the result that the electron current and the hole current flow in one-sided way. These phenomena are shown well in the electron current (FIG. 10(a)) and the all current line (FIG. 10(b)) of the IGBT. The electron current flows through the channel and the hole current flows along the channel by the JEFT effect in one-sided way. Therefore, in the IGBT, the decrease of the ON resistance has limits due to the channel resistance and the increase of the resistance by the JEFT effect.

Figure 11:
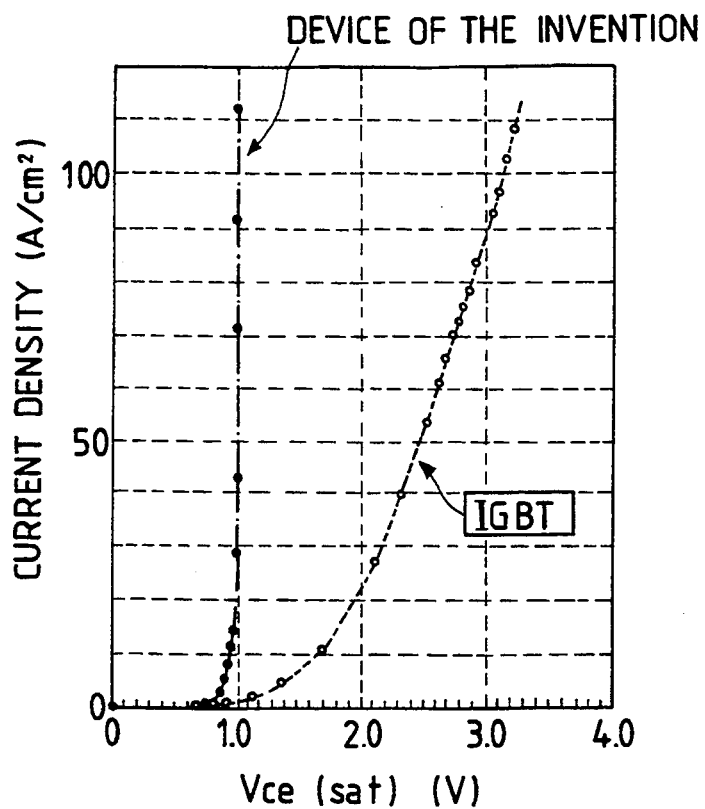
FIG. 11 is a graph showing current-voltage properties of the semiconductor device shown in FIG. 1 and an IGBT.

FIG. 11 shows current-voltage characteristics between the semiconductor device of this embodiment and the IGBT. As shown in FIG. 11, when in the semiconductor device of this embodiment, the voltage Vce between the source and the drain is about 1 V, the current density is rapidly increased, which means that the thyristor state having a low ON resistance is realized. Thus, according to the semiconductor device, the ON voltage necessary at the on time can be decreased. For example, the ON voltage in a state where the current density is 100 A/cm$^2$ is about 1.0 V in the semiconductor device of this embodiment, on the other hand about 3.2 V in the IGBT. Therefore, in the semiconductor device of this embodiment, it can be found that the ON voltage can be decreased to ⅓ of that of the IGBT. As explained before, it is considered that this is because, in the semiconductor device of this embodiment, the channel resistance does not exist as the electrons do not pass the channel and there is no resistance due to the JEFT effect as it does not exist.

Then, the operation at the turn-off in the semiconductor device of this embodiment will be explained. The semiconductor device of this embodiment is operated in the state of thyristor as described above. Therefore, since the electron current is not supplied through the channel formed by the first gate electrode 207, even if the channel is broken by applying a low level voltage to the first gate electrode 207, the semiconductor device of this embodiment is not turned off. Thus, it is necessary to realize the transistor state similar to that of the IGBT by turning the transistor Qnpn off by applying a high level voltage to the second gate electrode 225 and collecting the hole current being supplied to the p type base layer 204 of the base of the transistor Qnpn through the MOSFET portion 220 to the source terminal 231. As the result, since the pn junction between the source layer 205 and the p type base layer 204 is made again and the electron current, etc., can be controlled by the channel which is formed by the first gate electrode 207, the semiconductor device of this embodiment can be turned off by applying a low level voltage to the first gate electrode 207 to make the channel disappear.

Figure 12:
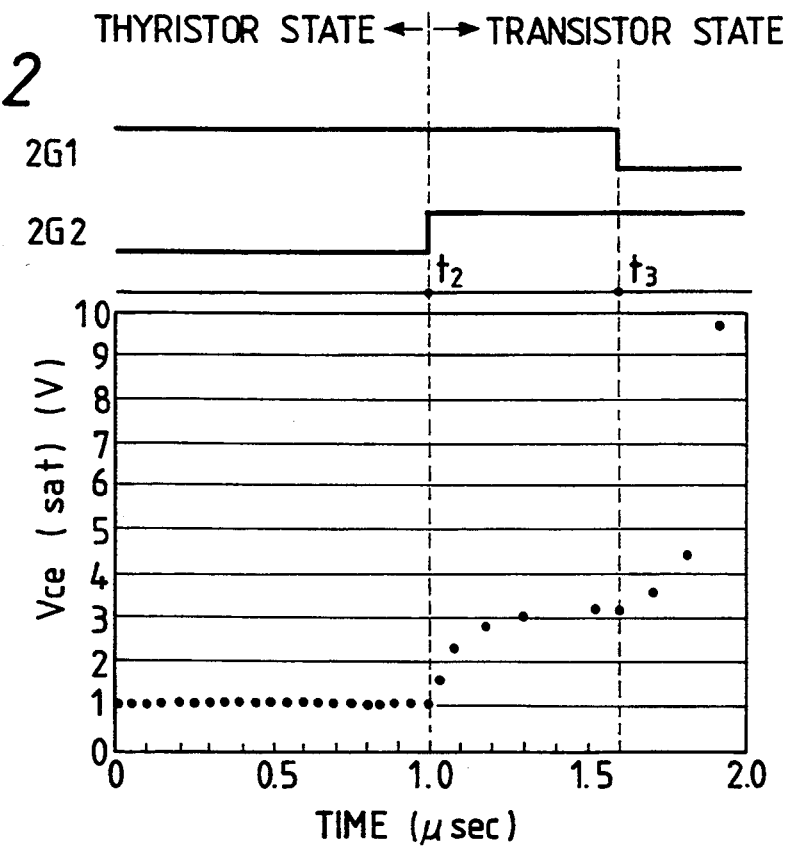
FIG. 12 is a graph showing states of signals of gate terminals G1 and G2, and change of voltage in changing from the thyristor state to the transistor state in the semiconductor device shown in FIG. 6, respectively.

FIG. 12 shows the change of the ON voltage of the semiconductor device of this embodiment as well as the signals which are supplied to the first and the second gate terminals 2G1 and 2G2. As can be seen from the drawing, when a high level signal is supplied to the gate terminal 2G2 at a time t2, the semiconductor device of this embodiment is changed from the thyristor state to a transistor state so that the ON voltage is increased from 1 V to 3.2 V as in the IGBT. Therefore, the semiconductor device of this embodiment can be turned off for a short turn-off time as in the IGBT by applying a low level signal to the gate terminal 2G1 at a time t3.

Figure 13A:
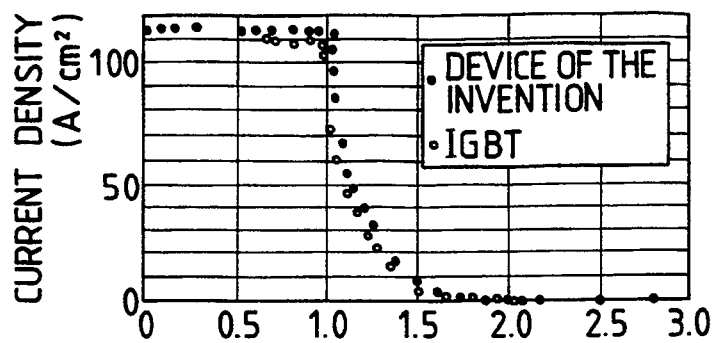
FIGS. 13(a), 13(b) and 13(c) are graphs showing the change of current at the turn-off time of the semiconductor device shown in FIG. 6 and IGBT, change of voltage at the turn-off time thereof, and the state of signals of gate terminals G1 and G2, respectively.
Figure 13B:
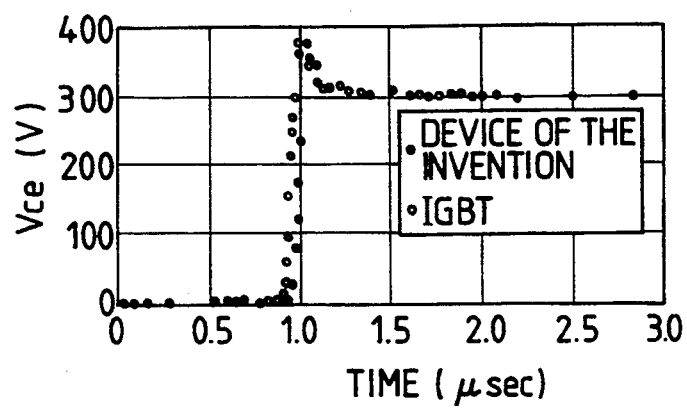
Figure 13C:
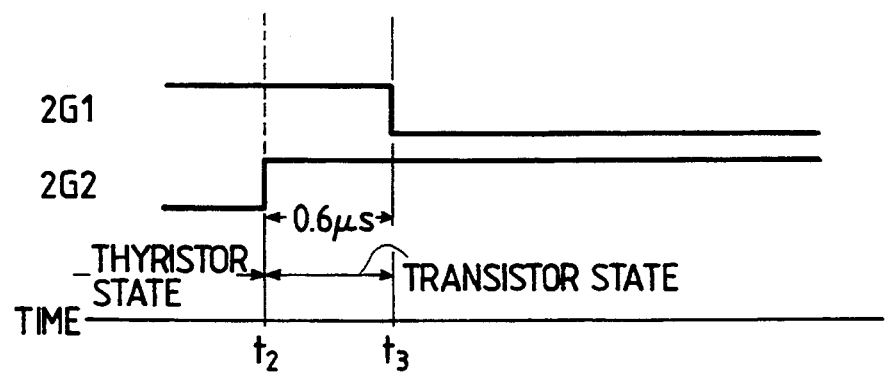

FIG. 13 shows the turn-off waveforms of the semiconductor device of this embodiment and the IGBT in comparison to each other. FIG. 13(a) shows the change of the current density and FIG. 13(b) shows the change of the voltage at a turn-off time when the semiconductor device of this embodiment and the IGBT are clamped at a voltage of 300 V and the breaking current density is set to 110 A/cm$^2$. As can be seen from the drawing, the semiconductor device of this embodiment is turned off by applying a low level signal to the gate terminal 2G1 at a time t3 (FIG. 3(c)), the semiconductor device of this embodiment is turned off while having just the same turn-off waveform as that of the IGBT. The turn-off time is short as in the IGBT.

As described above, the semiconductor device of this embodiment is a quite new device in which the thyristor state for a low ON voltage and the transistor state with a short turn-off time as in the IGBT can be realized by using two gate electrodes. Although as a technique for improving the devices such as MCT, IGBT, etc., to have high properties, the high speed and low drive power techniques by the MOS gate device, the low ON voltage technique by the thyristor structure and other high property technique by combination of various device structures have been developed, a device in which the trade-off of the decrease of the ON voltage and the switching time can be remarkably improved has not been founded. The present device was invented by a new conception that one device is controlled to states respectively suitable for on or off. A high performance power device having the low ON voltage of the thyristor and the short switching time of the IGBT and capable of controlling the thyristor by voltage drive can be realized.

EMBODIMENT 4

Figure 14:
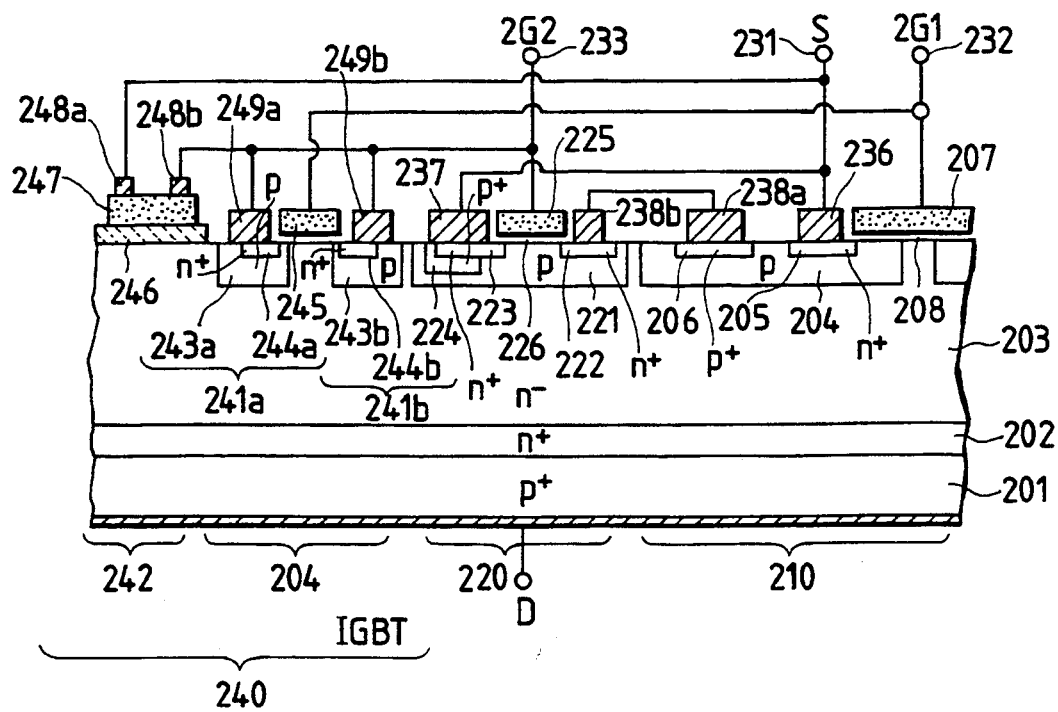
FIG. 14 is a cross-sectional view showing a structure of a semiconductor device of embodiment 4 of the present invention.

FIG. 14 shows a structure of a semiconductor device having a first gate and a second gate according to the embodiment 4 of the present invention. The semiconductor device of this embodiment is a vertical semiconductor device similar to that explained in the embodiment 3. In the semiconductor device of this embodiment, a p$^+$type semiconductor substrate on the back of which a drain electrode 235 is arranged is formed as a drain layer 201, and an n$^+$type buffer layer 202 and an n$^-$type base layer 203 are formed by the epitaxial growth, etc. On the surface of the n$^-$type base layer 203, a thyristor portion 210 having a function of a switching device, and a MOSFET portion 220 which controls the thyristor portion 210, are formed. The structure of these thyristor portion 210 and the MOSFET portion 220 is the same as in the embodiment 3. Thus, the explanation of the structure of the embodiment 4 is omitted while denoting the same reference numerals.

The point to be noted in the semiconductor device of this embodiment is that in addition to the thyristor portion 210 and the MOSFET portion 220, an overcurrent limiting portion 240 is formed on the n$^-$type base layer 203. This overcurrent limiting portion 240 is composed of an overcurrent detecting IGBT 241 capable of detecting the current which flows in the thyristor portion 210 and a polycrystalline silicon resistance 242 connected in series to this overcurrent detecting IGBT 241. The overcurrent detecting IGBT 241 is composed of two IGBTs 41a and 41b. Since these IGBTs 41a and 41b are the same structure, the explanation will be made below with reference to the IGBT 41a. The IGBT 41a is composed of a well shaped p type diffusion layer, i.e., a p type detecting base layer 243a formed on the surface of the n$^-$type base layer 203, an n$^{30}$ type detecting source layer 244a formed on the inner side surface of the p type detecting base layer 243a and a detecting electrode gate 245 disposed on the detecting source layer 44a, the detecting base layer 43a and the n$^-$type base layer 203 through the gate oxide film. This gate electrode 245 is connected to a first gate terminal 2G1 and the detecting IGBTs 41a and 41b are turned on and off at the same timing as in the thyristor portion 210.

A polycrystalline silicon resistance 242 is composed of polycrystalline silicon 247 disposed on the surface of the n$^-$type base layer 203 through the oxide film 246.

The one connecting terminal 248a of the resistance is connected to a source terminal 231 and the other connecting terminal 248b is connected to detecting source electrodes 249a and 249b disposed on detecting source layers 244a and 244b of the detecting IGBTs 241a and 241b and further connected to a second gate terminal 2G2.

Figure 15:
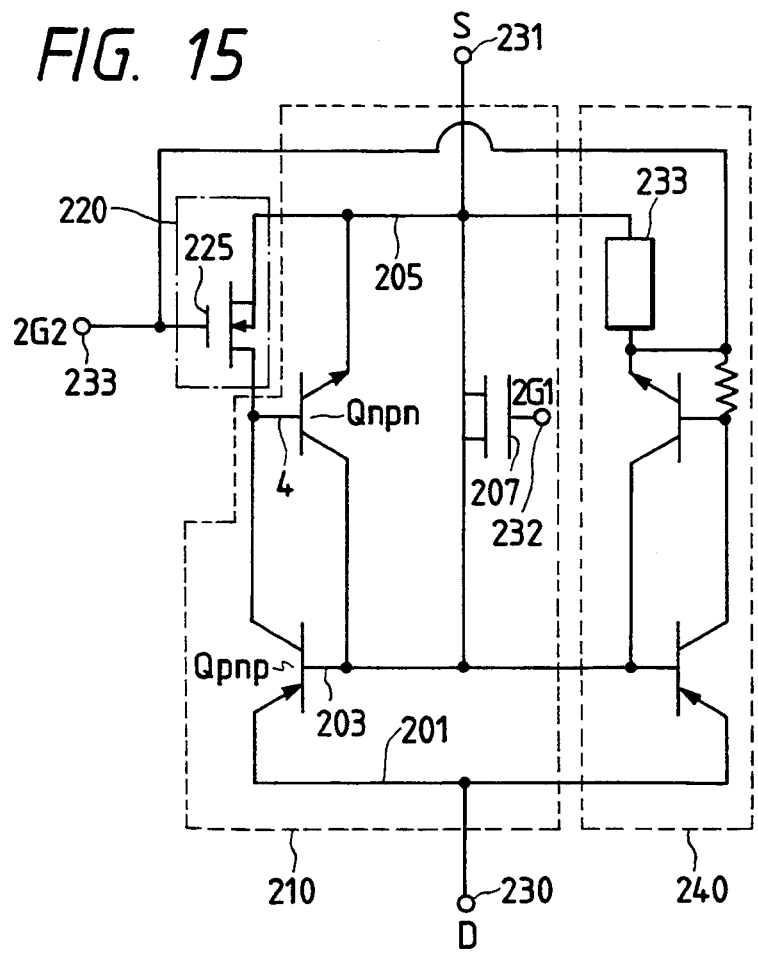
FIG. 15 is a circuit diagram showing an equivalent circuit of the semiconductor device shown in FIG. 14.

FIG. 15 shows an equivalent circuit of the semiconductor device of this embodiment. Since the structure of the thyristor portion 210 and the MOSFET portion 220 is the same as in the embodiment 3, the explanation of the structure is omitted while denoting the same reference numerals. The overcurrent limiting portion 240 additionally disposed on the semiconductor device of this embodiment is connected to the thyristor portion 210 in parallel. Namely, the drain of the detecting IGBTs 241a and 244b is common to the drain layer 201 of the thyristor portion 210. The one connecting terminal 248a of the polycrystalline silicon resistance 242 is connected to the source terminal 31.

Therefore, the current proportional to the current which flows in the thyristor portion 210 flows in the overcurrent limiting portion 240, and the down voltage corresponding to the current which flows in the overcurrent limiting portion 240 occurs in the other connecting terminal 248b of the polycrystalline silicon resistance. Further, since the other connecting terminal 248b is connected to the second gate terminal 2G2, overcurrent flows in the thyristor portion 210. When, in proportion to the overcurrent, an overcurrent flows in the overcurrent limiting portion 240, the voltage of the other connecting terminal 248b is increased to supply a high level voltage to the second gate terminal 2G2. Consequently, in the semiconductor device of this embodiment, a thyristor state is changed to a transistor state so that the semiconductor device can be turned off in a short time by supplying a low level voltage to the first gate terminal 2G1.

FIG. 16 shows a timing chart in which these operations are shown. First, when a high level signal is supplied to the first gate terminal 2G1 at a time t11, the semiconductor device of this embodiment is turned on. Since this state is a thyristor state as explained in the embodiment 3, the ON voltage is low. Next, by some reason, the semiconductor has an overcurrent state at a time t12 and the overcurrent is caused to flow to the thyristor portion 210. Since, at this stage, the semiconductor device of this embodiment has a thyristor state, even if a low level signal is supplied to the first gate terminal 2G1, the semiconductor device cannot be turned off. Thus, at an early stage, the state of the semiconductor device of this embodiment must be changed to a transistor state. In the semiconductor device of this embodiment, the overcurrent limiting portion 240 is provided. When overcurrent occurs, the voltage of the other connecting terminal 248b of the polycrystalline silicon resistance is increased in accordance with the occurrence of the overcurrent. Since the terminal 248b is connected to the second gate terminal 2G2, the voltage of the second gate terminal 2G2 is also increased in response to the increase of the voltage. As a result, when the voltage level of the second gate terminal 2G2 exceeds a threshold voltage at a time t13, the MOSFET portion 220 is electrically connected and the thyristor state of the semiconductor device of this embodiment is changed to a transistor state. Therefore, when a low level signal is supplied to the first gate terminal 2G1 at time t14, the semiconductor device of this embodiment immediately comes to a halt.

Thus, in the semiconductor device of this embodiment, the thyristor state can be automatically changed to the transistor state in the overcurrent state and the semiconductor device can be halted in accordance with the signal input from the outer portion. Thus, the firing damage, etc., of the semiconductor device due to the overcurrent can be previously prevented and the overcurrent detecting and protecting device-containing intelligent power semiconductor device can be realized. Further, since all of the IGBT for detecting the overcurrent and the detecting resistance can be provided in the semiconductor device itself, a switching device having such functions can be treated as a single semiconductor element. Further, the semiconductor device of this embodiment is turned on at a thyristor state as explained above and it can be turned off after the change to a transistor state. Therefore, the semiconductor device has features that the low ON voltage and at the same time, the reduction of the turn-off time have been provided. Also, in a high frequency application, the switching loss can be prevented. Thus, by using the semiconductor device of this embodiment, a semiconductor device having improved properties such as the low ON voltage, short turn-off time, etc., can be realized while mounting the protecting function.

Additionally, the embodiments 3 and 4 have been explained with reference to a vertical semiconductor device in which a source layer and a drain layer are disposed on a surface side and a back side, respectively. Nevertheless, the present semiconductor device can be realized in a horizontal device in which the source layer and the drain layer are arranged on the same surface.

As described above, in the semiconductor device according to the embodiment 3 or 4, the low ON voltage as in the thyristor can be realized at on time by using the first gate electrode and the second gate electrode, and the short switching time as in the IGBT can be also realized at off time. Thus, according to the present invention, the trade-off of the switching time and the ON voltage, which could not be realized in the conventional power semiconductor device such as MCT, IGBT, etc., can be remarkably improved. Therefore, according to the present semiconductor device, the power device which is used in devices and circuits for middle and large current, and for middle and high break down voltage can be obtained with high performances. Further, since, in the present semiconductor device, the ON voltage is low and the switching speed is great, the switching loss can be reduced to a great extent in applying the high frequency. Thus, by using the semiconductor device according to the present invention, the low switching loss and miniaturization of various devices, which are required in saving of electric power can be realized.

Further, the overcurrent protecting function can be built-in so that a semiconductor having a low ON voltage, a high switching speed and a low switching loss can be realized.

FIG. 17 shows a structure of a semiconductor device including a MOS gate thyristor (a semiconductor device including MIS gate thyristor) with a first gate, a second gate and a third gate according to embodiment 5 of the present invention. The semiconductor device of this embodiment can be called as a triple gate MOS thyristor (TIGMOT) since the device is formed by adding the third gate to a dual gate MOS thyristor (DUGMOT) having two gates. The semiconductor device 301 of this embodiment is a horizontal semiconductor device and has, at a surface side of an n⁻type base region 313, a thyristor portion 302 having a function as switching device, a first control MOS portion 303 (a first control switching portion) formed in a region separated from a forming region of the thyristor portion 302 to control the operation state of the thyristor portion 302 and a drain portion 304 formed in a region separated from these first control MOS portion 303 and the thyristor portion 302. The drain portion 304 has a second control MOS portion 304a (a second control switching portion) which changes the structure of the drain portion 304 to a drain short structure at the turn-off time.

The thyristor portion 302 includes a well-shaped p type diffusion region, i.e., p type base region 314a formed on a surface of an n⁻type base region 313, an n⁺type source region 315 formed on the inner side surface of the p type base region 314a and a p⁺type contact region 16. A first gate electrode 320 is disposed across the source region 315, the p type base region 314a and the n⁻type base region 313 through a gate oxide film 341a at those surface side. Further, a first gate terminal 331 (gate terminal 3G1) is electrically connected to the first gate electrode 320. The thyristor portion 302 can be operated by the signal supplied from the outer portion to the first gate electrode 320 through the first gate terminal 331. Further, a connecting electrode is electrically connected to the p⁺type contact region 316.

On the other hand, the first MOS portion 303 is formed as a horizontal MOSFET portion and includes a well-shaped p type diffusion region, i.e., p type MOS base region 314b formed on a surface of an n⁻type base region 313, an n⁺type MOS drain region 317 and a MOS source region 318 formed on the inner side surface of the p type MOS base region 314b, and a p⁺type MOS contact region 319. A second gate electrode 321 is disposed across the MOS source region 318, and the MOS drain region 317 through a gate oxide film 341b. A second gate terminal 332 (a second gate terminal 3G2) is electrically connected to the second gate electrode. Also, a MOS source electrode 28 is electrically connected to the n⁺type MOS source region 318, the p⁺type MOS contact region 319 and p type MOS base region 314b. The MOS source electrode 328 is electrically connected to a source terminal 333 (a source terminal S) of the thyristor portion 302 to be supplied with a source potential. On the other hand, a MOS drain electrode 327 is electrically connected to the n⁺type MOS drain region 317. The MOS drain electrode 327 is electrically connected to a connecting electrode 326 of the thyristor portion 302. Thus, the first control MOS portion 303 is turned on or off by the signal supplied from the outer portion to the second gate electrode 321 through the second gate terminal 332 so that the connection between the n⁺type source region 315 and the p type base region 314a can be contracted.

On the other hand, in the surface side of the n⁻type base region 313 of the drain portion 304, an n⁺type buffer region 312 is formed, and in the surface side of the n⁺type buffer region 312, a p⁺type drain region 11 is formed. In the surface side of the p⁺type drain region 11, an n⁺type drain region 342 is formed. The n⁺type drain region 342 is electrically connected to a drain electrode 322. Also, in the surface side of the n⁺type drain region 342 and the n⁺type buffer region 312, a third gate electrode 324 facing to the p⁺type drain region 311 through the gate oxide film 341c is formed so that a second control MOS portion 304a in which the n⁺type buffer region 312 (the side of n type base region 313) is acted as a source and the n type drain region 342 is acted as a drain is formed. Further, a third gate terminal 335 (a third gate terminal 3G3) is electrically connected to the third gate electrode 324 of the second control MOS portion 304a. The second control MOS portion 304a is turned on or off by the signal supplied from the outer portion through the third gate terminal 335, and the connection between the n⁺type drain region 342 and n⁺type buffer region 312 can be controlled, namely, the connection between the side of the n⁻type base region 313 and the side of the drain electrode 322 can be controlled. Additionally, a drain terminal 34 (a drain terminal D) is electrically connected to the drain electrdoe 322.

Figure 18:
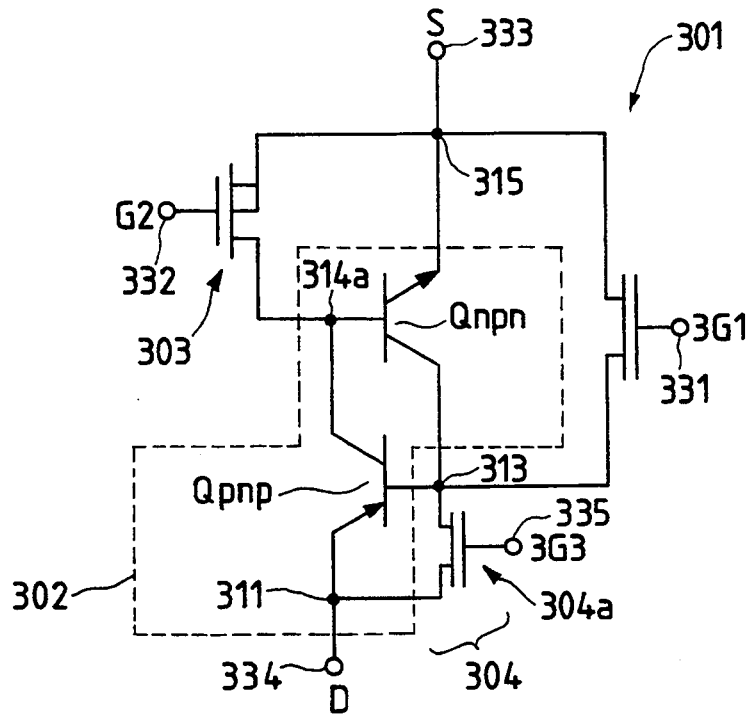
FIG. 18 is a circuit diagram showing an equivalent circuit of the semiconductor device shown in FIG. 17.

FIG. 18 shows an equivalent circuit of the semiconductor device 301 of this embodiment. The semiconductor device 301 of this embodiment is composed of the thyristor portion 302 which is controlled by the first gate terminal 3G1, the first control MOS portion 303 which is controlled by the second gate terminal 3G2 and the second control MOS portion 304a which is controlled by the third gate terminal G3. The thyristor portion 302 includes an npn type transistor Qnpn composed of the n⁺type source region 315, the p type base region 314a and the n⁻type base region 313, and a pnp type transistor Qpnp composed of the p type base region 314a, the n⁺type base region 313 (n⁺type buffer region 312) and the p⁺drain region 11. Therefore, the thyristor is composed of the transistors Qnpn and Qpnp. When a channel is formed just under the first gate electrode 320 by the signal from the first gate terminal 3G1, the transistor Qpnp is turned on, and the hole current is supplied to the p type base region 314a which is a base of the transistor Qnpn through the transistor Qpnp. Consequently, this thyristor is turned on.

The semiconductor device 301 of this embodiment includes the first control MOS portion 303 capable of connecting the p type base region 314a which is a base of the transistor Qnpn to the source terminal S in addition to the thyristor portion 2. Thus, when the first control MOS portion is turned on by the signal supplied to the second gate terminal G2, the hole current supplied to the base of the transistor Qnpn is caused to flow to the source terminal S side and the transistor Qnpn is turned off. Consequently, the semiconductor device 301 of this embodiment is changed from the thyristor state to the transistor state in which the transistor Qpnp is on.

Further, the semiconductor device 301 of this embodiment includes provided the second control MOS portion 304a capable of connecting the n⁻type base region 313 which is a base of the transistor Qpnp to the drain terminal D. Thus, when the second control MOS portion 304a is turned on by the signal supplied to the third gate terminal 3G3, the drain portion 304 forms an anode short structure so that the supply of holes to the n⁻type base region 313 which is a base of the transistor Qpnp is prevented and the extraction of the electrons from the n⁻type base region 313 to the drain terminal D is accelerated after the turn-off. Also, the reinjection of the holes to the n⁻type base region 313 does not occur. Consequently, in the semiconductor device 301 of this embodiment, the turn-off time can be shortened in comparison with a normal IGBT.

Figure 19:
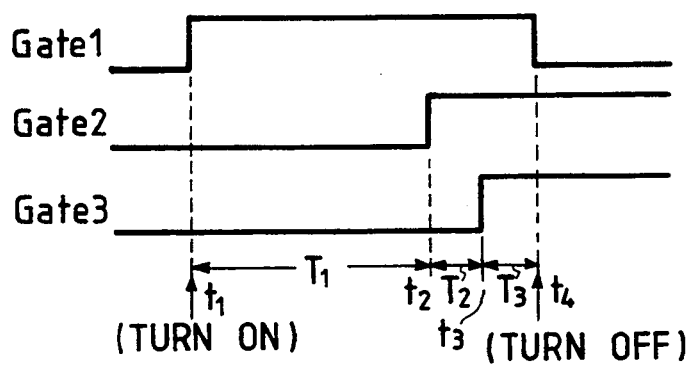
FIG. 19 is a timing chart of signals which are supplied to the three gate terminal of the semiconductor device shown in FIG. 17.

FIG. 19 shows a timing chart of the control signals for controlling the semiconductor device 301 of this embodiment, which is supplied from the outer portion to the first gate 3G1, the second gate 3G2 and the third gate 3G3. In the semiconductor device 301 of this embodiment, each MOSFET having the first gate electrode 320 which is controlled by the first gate terminal 3G1, the second gate electrode 321 which is controlled by the second gate terminal 3G2 and the third gate electrode 323 which is controlled by the third gate terminal 3G3 respectively has an n channel type structure. In this case, the respective MOSFET can be turned on by supplying the high level signals to each gate terminals 3G1, 3G2 and 3G3. First, when a high level signal is supplied to the first gate terminal 3G1 at a time t1, the transistor Qnpn and the transistor Qpnp are turned on and operated in a thyristor state. Next, when a high level signal is supplied to the second gate terminal 3G2 at a time t2, the transistor Qnpn is turned off and the state of the semiconductor device 301 is changed to the transistor state. Thus, a low level signal is supplied to the first gate terminal 3G1 at a time t4, the transistor Qpnp can be turned off and the semiconductor device 301 is not operated. Then, in the semiconductor device 301 of this embodiment, a high level signal is supplied to the third gate terminal 3G3 at a time t3 before turning off the device to change the type of the drain portion to an anode short type. Namely, the second control MOS portion 304a is turned on by the high level signal supplied from the outer portion through the third gate terminal 335 so that the connection between the n+type drain region 342 and the n+type buffer region 312 is made; in other words, the connection between the side of the n−type base region 313 and the drain terminal D (the side of the drain electrode 322) is made. Consequently, the number of the holes which are supplied from the p+type drain region 312 to the n−type base region 313 is reduced and the electrons can be easily extracted from the n−type base region 313 so that the device is easily turned off. Therefore, the semiconductor device 301 of this embodiment forms such a power device that can be turned on in the thyristor state in which the ON voltage is low at the start of the operation, and becomes an anode short type IGBT which has a shorter turn-off time than the turn-off time of a general IGBT.

Figure 20:
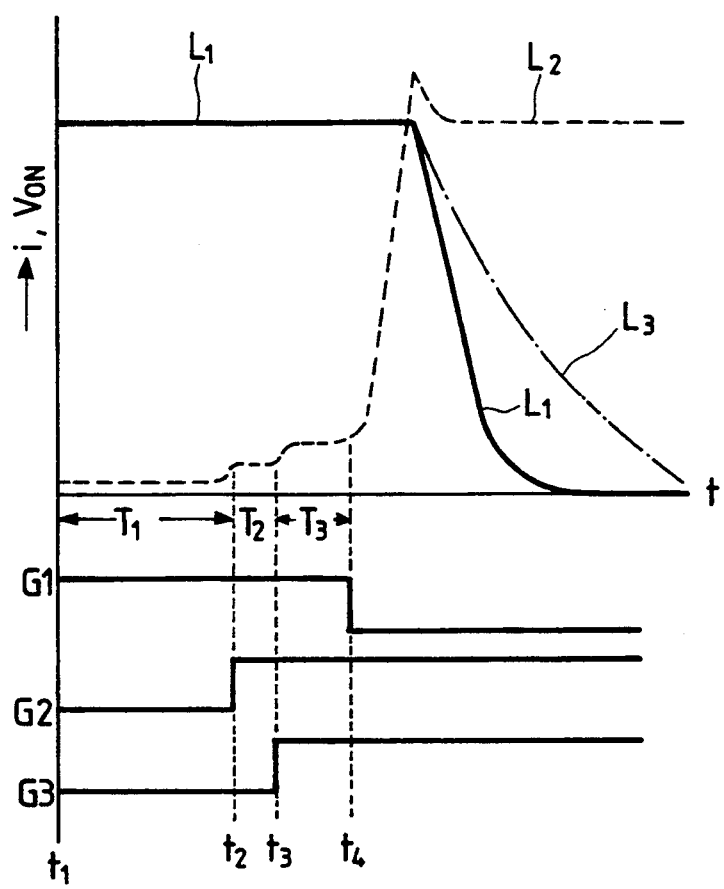
FIG. 20 is a graph showing changes of current and voltage in changing a thyristor state to a transistor state and in the turn-off in the semiconductor device shown in FIG. 17 and in a conventional IGBT.

To explain the operating state, FIG. 20 shows the current waveform and the voltage waveform of the semiconductor device 301 in accordance with signals which are supplied to the first gate terminal 3G1, the second gate terminal 3G2 and the third gate terminal 3G3. In this drawing, the current waveform of the semiconductor device 301 is shown by the solid line L1 and the voltage waveform thereof is shown by the dotted line L2. For the comparison, the current waveform of a conventional IGBT is shown by one dot and chain line L3.

Referring to this drawing, when a high level voltage is applied to the first gate electrode 3G1 at a time t1, the electron current flows from the source region 315 to the n−type base region 313 through the channel just under the first gate electrode 320 formed on the surface of the p type base region 314a. Since, in accordance with this operation, holes flow from the p+drain region 311 to the n−type base region 313, the n−type base region 313 has a conductivity modulation state. This state is a state in which the built-in transistors Qpnp and Qnpn in the semiconductor device 1 of this embodiment explained above are turned on, which state corresponding to the thyristor state. As a result, the pn junction at the boundary A between the source region 315 and the p type base region 314a shown in FIG. 17 is broken so that the electron current is caused to flow from the entire source region 315 to the drain region 304. Namely, the electron current reaches the p drain region 311 from the source region 315 through the p type base region 314a, the n−type base region 313 and the n+type buffer region 312. Therefore, in the period T1, the semiconductor device 301 is operated under a very low ON resistance condition and has a low ON voltage (Von) as shown by the dotted line L2.

On the other hand, when a high level voltage is applied to the second gate electrode G2 after the time t2, the thyristor operation is not carried out. When the electron current is supplied from the source region 315 to the n−base region 313 through the channel formed in the p type base region, the n−type base region 313 has a conductivity modulation to decrease the resistance. Nevertheless, the pn junction at the boundary A between the source region 315 and the p type base region 314a is maintained. Consequently, the electron current flows through the channel and the hole current flows in one-sided way, namely, the electron current and the hole current flow along the channel by the JEFT effect. Therefore, in the period T2, the ON voltage (Von) of semiconductor device 301 is increased a little by the increases of the channel resistance and the increase of resistance due to the JEFT effect as shown by the dotted line L2.

Then, when a high level voltage is applied to the third gate electrode 3G3 after the time t3, the second control MOS portion 304 is turned on. Subsequently, when the connection between the n+type drain region 342 and the n+type buffer region 312 is made, namely, the connection between the side of the n−type base region 313 and the side of the third gate electrode 322 is made, the number of the holes which are supplied to the n−type base region 313 is reduced, so that the ON resistance of semiconductor device 301 is increased a little and the ON voltage (Von) is increased a little in the period T3 as shown by the dotted line L2. Nevertheless, since electrons are easily extracted from the n−type base region 13 to the drain electrode 322, after the semiconductor device 301 is turned off by applying a low level voltage to the first gate electrode 3G1 at a time t4, the semiconductor device 301 has a short turn-off time in comparison with a conventional IGBT (the current waveform is shown by the one dot and chain line L3) as shown by the solid line L1.

Since the semiconductor device 301 is operated in the thyristor state as described above and the electron current is not supplied through the channel formed by the first gate electrode 320, even if a low level voltage is applied to the first gate electrode 320 to remove the channel, the semiconductor device 301 cannot be turned off. However, by applying a high level voltage is applied to the second electrode 21 to collect the hole electrons, which are supplied to the p type base region 304 corresponding to the base of the transistor Qnpn through the first control MOS portion 303, to the source terminal 333, the transistor Qnpn is turned off to realize the same transistor state as in the IGBT and then the semiconductor device 301 is caused to turn off. Then, since the pn junction between the source region 315 and the p type base region 314a is made again and electron currents can be controlled by the channel which is formed by the first gate electrode 320, the semiconductor device 301 of this embodiment can be turned off by applying a low level voltage to the first gate electrode 320 to remove the channel.

Thus, the semiconductor device 301 of this embodiment forms a new device in which after the device was caused to have a low ON voltage thyristor state by using the first gate electrode 320, the thyristor state is changed to a usual IGBT state by using the second gate electrode 321 and the usual IGBT state is changed to an anode short type IGBT state by using the third gate electrode 324 so that the device has a low ON voltage and a short turn-off time.

Conventionally, as the techniques in which devices such as MCT, IGBT, etc., are caused to have high performances, techniques in the high speed and the low drive power due to the MOS gate device, technique in the low ON voltage due to the thyristor structure and technique to have high performances due to combinations of various device structures have been known. However, the device in which the trade-off of the reduction of the ON voltage and the switching time can be remarkably improved have not been conventionally found. On the other hand, the semiconductor device 301 of this embodiment was invented by the new conception that the on or off operation of one device is controlled to the respectively suitable condition. According to the present invention, a high performance power device having a low ON voltage in the thyristor, a short switching time corresponding to that of the anode short type IGBT and capable of controlling the thyristor by the voltage drive can be realized. Thus, loss reduction and miniaturization of various devices, which have been required from the power saving point of view, can be realized. Further, since the semiconductor device has a low ON voltage and a high switching speed, the loss can be remarkably decreased in the application of the high frequency. Additionally, since the semiconductor device 301 of this embodiment has all of the electrodes in the surface side of the substrate, the wiring with the other devices is easy.

As described above, the semiconductor device including the MIS gate thyristor according to embodiment 5 of the present invention, in the surface side of the semiconductor substrate, a first control switching portion, for example, a first control MIS portion in which the operation of the thyristor portion is controlled from the thyristor state to the transistor state and a second control switching portion, for example, a second control MIS portion whose drain portion side forms a short drain structure. Thus, since, according to the present invention, the low ON voltage as in the thyristor can be realized at on time and a high speed switching which is obtained in, for example, an anode short type IGBT can be also realized at off time, the trade-off of the switching time and the ON voltage, which could not be realized in the conventional power semiconductor device can be remarkably improved, and the power device used in devices and circuits for middle and large current and for middle and high breakdown voltage can be obtained with high performances.

Additionally, as the structural elements such as electrode are disposed in the surface side of the substrate, the wiring with other device regions is easy.

What is claimed is:

1. A semiconductor device, comprising:
a second conductive type base region;
a first conductive type drain region formed in a surface of said second conductive type base region;
a drain electrode connected to said first conductive type drain region;
a first conductive type first base region formed in said surface of said second conductive type base region and at a position separated from said first conductive type drain region;
a first conductive type second base region formed in said surface of said second conductive type base region and at a position separated from said first conductive type drain region and said first base region;
a first MIS portion capable of connecting a second conductive type first source region formed in said first base region to said second conductive type base region; and
a second MIS portion including a second conductive type second source region formed in said second base region and a second conductive type drain region formed in said second base region;
wherein said first source region and said second source region are electrically connected, and said first base region and said second conductive type drain region are electrically connected.

2. A semiconductor device, comprising:
a second conductive type base region;
a first conductive type drain region formed in a surface of said second conductive type base region;
a drain electrode connected to said first conductive type drain region;
a first conductive type first base region formed in said surface of said second conductive type base region and at a position separated from said first conductive type drain region;
a first conductive type second base region formed in said surface of said second conductive type base region and at a position separated from said first conductive type drain region and said first base region;
a first MIS portion capable of connecting a second conductive type first source region formed in said first base region to said second conductive type base region; and
a second MIS portion including a second conductive type second source region formed in said second base region and a second conductive type drain region formed in said second base region;
wherein said first source region and said second source region are electrically connected, and said first base region and said second conductive type drain region are electrically connected; and
wherein said drain electrode is electrically connected to a side of said second conductive type base region as well as said first conductive type drain region.

3. A semiconductor device as claimed in claim 2, wherein said first conductive type drain region is formed in a second conductive type buffer region formed in said surface of said second conductive type base region, and said drain electrode is electrically connected to said second conductive type base region through said buffer region.

4. A semiconductor device, comprising:
a second conductive type base region;
a first conductive type drain region to which a drain electric potential is applied;
a thyristor portion including, at a position over said second conductive type base region and facing said first conductive type drain region, a first conductive type base region, a source region formed in said first conductive type base region and to which a source electric potential is applied, and a first gate electrode disposed over said source region, said first conductive type base region and said second conductive type base region; and a control MISFET including a second gate electrode capable of controlling a connection of said first conductive type base region with said source region.

5. A semiconductor device, comprising:
a second conductive type base region;
a first conductive type drain region to which a drain electric potential is applied;
a thyristor portion including, at a position over said second conductive type base region and facing said first conductive type drain region, a first conductive type base region, a source region formed in a said first conductive type base region and to which a source electric potential, and a first gate electrode disposed over said source region, said first conductive type base region and said second conductive type base region; and
a control MISFET portion including a first conductive type MIS base region formed on said second conductive type base region separately from said first conductive type base region, and a control MISFET provided with a second gate electrode formed above said first conductive type MIS base region;
wherein said control MISFET includes a second conductive type MIS source layer to which said source electric potential is applied, said source electric potential also applied to said MIS base region, and a second conductive type MIS drain layer connected to said first conductive type base region.

6. A semiconductor device as claimed in claim 4 or 5, further comprising:
an electric current detecting portion including at least one set of a first conductive type detection base layer in said second conductive type base region, a second conductive type detection source layer formed in said detection base layer and a detection gate electrode disposed over said detection source layer and said second conductive type base region; and
a resistance means connected in series to said detection source layer and through which said source electric potential is applied to said detection source layer, said detection source layer being connected to said second gate electrode.

7. A semiconductor device as claimed in claim 6, wherein said resistance means is a polycrystalline silicon resistance formed above said second conductive type base region.

8. A semiconductor device, comprising:
a first conductive type base region;
a second conductive type drain region to which a drain electric potential is applied through a drain electrode;
a thyristor portion including a second conductive type base region formed at a position separated from said second conductive type drain region, a source region formed in said second conductive type base region and to which a source electric potential is applied and a first gate electrode disposed over said source region, said second conductive type base region and said first conductive type base region;
a first control switching portion capable of controlling a connection between said source region and said second conductive type base region; and
a second control switching portion capable of controlling a connection between said first conductive type base region and said drain electrode; a second conductive type drain region, a thyristor portion, a first control switching portion and a second control switching portion being formed at a surface side of said first conductive type base region.

9. A semiconductor device as claimed in claim 8, wherein said first control switching portion includes a first control MIS portion on a second conductive type MIS base region formed in said first conductive type base region so as to be separated from said second conductive type base region, said first control MIS portion including a first conductive type MIS source region to which said source electric potential is applied, said source electric potential also being applied to said second conductive type MIS base region; a first conductive type MIS drain region connected to said second conductive type base region; and a second gate electrode formed over surfaces of said first conductive type MIS source region and said first conductive type MIS drain region and supplied with a control signal.

10. A semiconductor device as claimed in claim 8 or 9, wherein said second control switching portion includes a second control MIS portion including a source at a side of said first conductive type base region; a first conductive type drain region formed in said second conductive type drain region and electrically connected to said drain electrode; and a third gate electrode formed over surfaces of said source region and said first conductive type drain region and supplied with a control signal.

* * * * *